United States Patent
Engel et al.

(10) Patent No.: US 6,654,278 B1
(45) Date of Patent: Nov. 25, 2003

(54) MAGNETORESISTANCE RANDOM ACCESS MEMORY

(75) Inventors: Bradley N. Engel, Chandler, AZ (US); Jason Allen Janesky, Mesa, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/209,156

(22) Filed: Jul. 31, 2002

(51) Int. Cl.$^7$ .............................................. G11C 11/14
(52) U.S. Cl. ...................................... 365/158; 365/173
(58) Field of Search .............................. 365/158, 171, 365/173, 157

(56) References Cited

U.S. PATENT DOCUMENTS

| | | | |
|---|---|---|---|
| 6,169,689 B1 * | 1/2001 | Naji ............................ | 365/173 |
| 6,392,924 B1 * | 5/2002 | Liu et al. ..................... | 365/158 |
| 6,538,919 B1 * | 3/2003 | Abraham et al. ............ | 365/171 |

* cited by examiner

*Primary Examiner*—Tan T. Nguyen
(74) *Attorney, Agent, or Firm*—William E. Koch

(57) ABSTRACT

A magnetoresistive tunneling junction memory cell comprises a magnetoresistive tunneling barrier (16), a bit magnetic region (15), a reference magnetic region (17), and current lines (20, 30) for inducing an applied magnetic field in the bit and reference magnetic regions. The bit magnetic region has a bit magnetic moment (43, 40,1425, 1625, 1950, 2315) that has a polarity in a bit easy axis (59, 1435) when there is no applied magnetic field. The tunneling barrier and the bit and reference magnetic regions form a magnetoresistive tunneling junction device (10, 72, 73, 74, 75, 76). In some implementations (73, 74, 75), the reference magnetic region has a reference magnetic moment (40, 1430, 1440, 1920, 1925) that is non-parallel to the bit easy axis. In other implementations (76), the reference magnetic region has a magnetization vortex (2310) with a net reference magnetic moment that is essentially zero. An applied magnetic field changes the magnetic state of the reference magnetic region such that the magnetic state of the bit magnetic region can be determined by a magnetoresistive measurement.

37 Claims, 11 Drawing Sheets

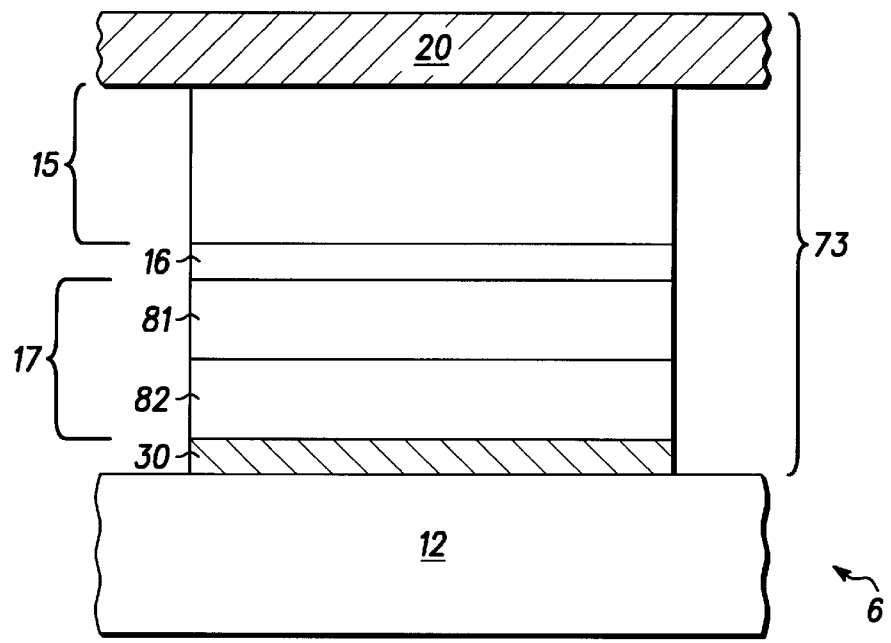
FIG. 14
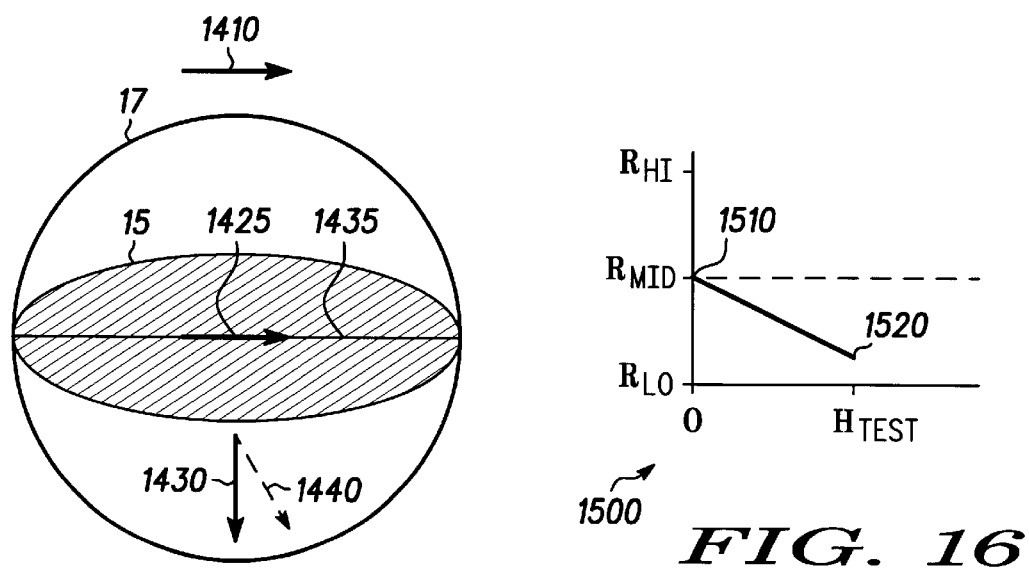
FIG. 15
FIG. 16

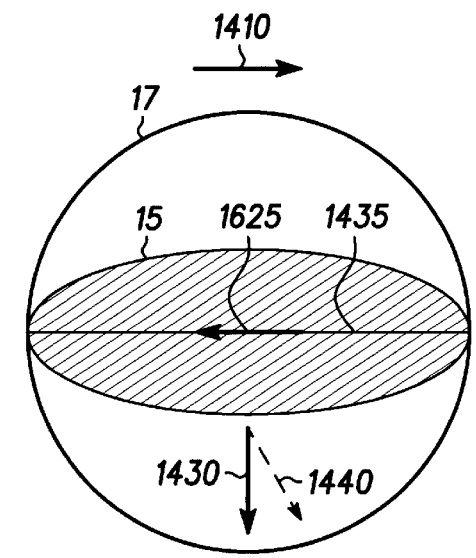
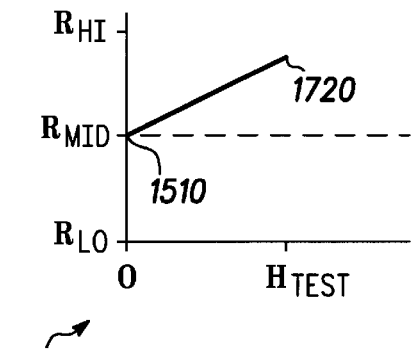
*FIG. 18*
*FIG. 17*
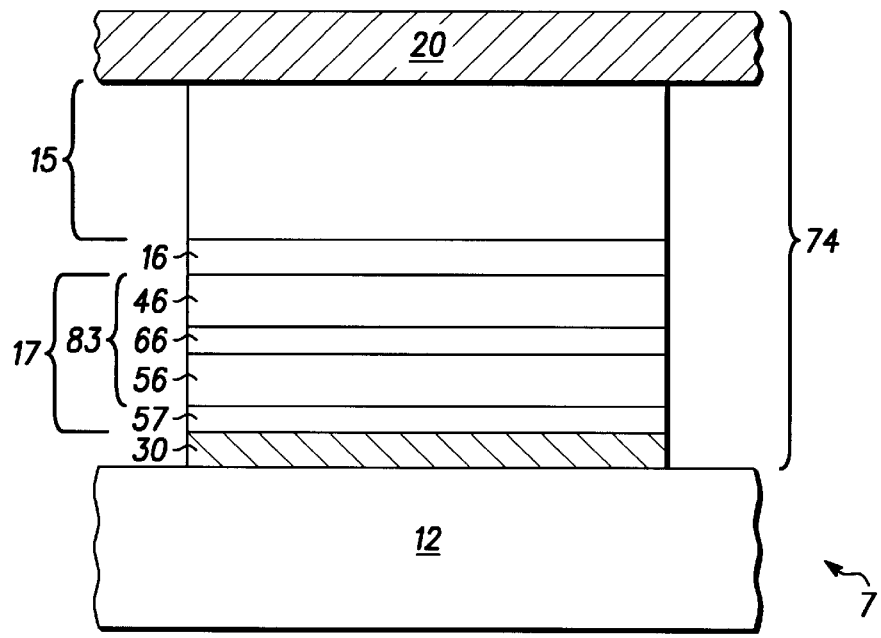
*FIG. 19*

MAGNETORESISTANCE RANDOM ACCESS MEMORY

CROSS-REFERENCE TO RELATED APPLICATION

This application is related to a co-pending application entitled "CIRCUIT AND METHOD FOR READING A TOGGLE MEMORY CELL" U.S. Ser. No. 10/184,811 filed on Jun. 28, 2002, assigned to the assignee of the instant application, and hereby incorporated by reference.

FIELD OF THE INVENTION

This invention relates to semiconductor memory devices, and in particular, the present invention relates to semiconductor random access memory devices that utilize a magnetic field.

BACKGROUND OF THE INVENTION

Memory devices are an extremely important component in electronic systems. The three most important commercial high-density memory technologies are SRAM (static random access memory), DRAM (dynamic random access memory), and FLASH (a form of non-volatile random access memory). Each of these memory devices uses an electronic charge to store information and each has its own advantages. SRAM has fast read and write speeds, but it is volatile and requires large cell area. DRAM has high density, but it is also volatile and requires a refresh of the storage capacitor every few milliseconds. This requirement increases the complexity of the control electronics.

FLASH is the major nonvolatile memory device in use today. Typical non-volatile memory devices use charges trapped in a floating oxide layer to store information. Drawbacks to FLASH include high voltage requirements and slow program and erase times. Also, FLASH memory has a poor write endurance of $10^4$–$10^6$ cycles before memory failure. In addition, to maintain reasonable data retention, the thickness of the gate oxide has to stay above the threshold that allows electron tunneling, thus restricting FLASH's scaling trends.

To overcome these shortcomings, new magnetic memory devices are being evaluated. One such device is magnetoresistive RAM (hereinafter referred to as "MRAM"). MRAM has the potential to have speed performance similar to DRAM. To be commercially viable, however, MRAM must have comparable memory density to current memory technologies, be scalable for future generations, operate at low voltages, have low power consumption, and have competitive read/write speeds. Conventional MRAM devices store information by programming a free magnetic layer of a bit storage cell to have its magnetic moment either parallel or anti-parallel to that of a fixed magnetic layer. The two magnetic layers are located on either side of a thin insulating barrier forming a magnetoresistive tunnel junction. The electrical resistance of this tunnel junction is either low (parallel) or high (anti-parallel) depending on the relative orientation of the magnetic moments. To readout the MRAM state, the resistance of a bit cell is compared to that of a reference cell. The reference cell is usually another MRAM bit or group of bits that is magnetically set at the time of fabrication and not switched during operation of the MRAM. These bits may be combined to form a midpoint reference for comparison. All bits in the low state will have a resistance lower than these midpoint reference bits, therefore providing the means to determine the state of the bit.

The main problem with this approach is that there can be significant bit-to-bit resistance variations due to variations in material and process quality. These variations may at times make it impossible to distinguish and isolate the high, low and midpoint resistances from one another. For example, if a low resistance bit is in the tail of the distribution significantly above the mean, it may overlap with the tail of the midpoint cell distribution and be impossible to determine or be determined incorrectly. Depending on the amount of resistance variation, a large array could have many bits in the overlap regions.

It would be highly advantageous, therefore, to remedy the foregoing and other deficiencies inherent in the prior art.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings:

FIG. 14 is a cross sectional view of a portion of an MRAM array that includes an MRAM device, in accordance with embodiments of the present invention;

FIGS. 15–18 are plan views and graphs used to describe the read operation of the MRAM described with reference to FIG. 14;

FIG. 19 is a cross sectional view of a portion of an MRAM array that includes an MRAM device, in accordance with embodiments of the present invention;

DETAILED DESCRIPTION OF THE PREFERRED EMBODIMENT

Figure 1:
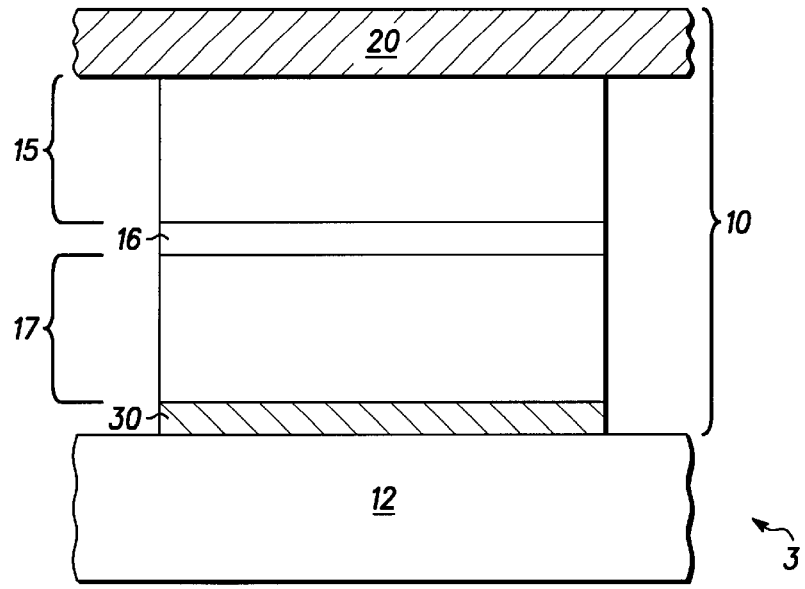
FIG. 1 is a simplified cross-sectional view of a magnetoresistive random access memory (MRAM) device, in accordance with embodiments of the present invention.

Referring to FIG. 1, a simplified cross-sectional view of a generalized MRAM array 3 is shown, in accordance with the present invention. In this illustration, only a single magnetoresistive memory device (or cell) 10 is shown, but it will be understood that MRAM array 3 consists of a number of MRAM devices 10 and only one such device is shown for simplicity in describing the reading method.

MRAM device 10 is a magnetoresistive tunneling junction memory cell, or magnetoresistive tunneling junction device (MTJD) that comprises material layers sandwiched between writing conductors that are a word line 20 and a digit line 30. Word line 20 and digit line 30 include conductive material through which a current can be passed. In this illustration, word line 20 is positioned on top of MRAM device 10 and digit line 30 is positioned on the bottom of MRAM device 10 and is directed at a 90° angle to word line 20 (See FIGS. 2 and 3). It will be appreciated that conductors such as word line 20 and digit line 30 need not be in physical contact with the other layers of the MRAM device 10 for efficient reading and writing operation, the conductors just need to be sufficiently near the regions to which the magnetic field is to be applied such that the magnetic field is effective.

MRAM device 10 includes a bit magnetic region 15, a reference magnetic region 17, and an electrically insulating material that forms a layer that acts as a tunneling barrier 16, as well as those portions of the word line 20 and digit line 30 that carry currents that affect the operation of the MRAM device 10. The bit magnetic region 15 and reference magnetic region 17 may each comprise more than one layer, some of which can have a magnetic moment (all magnetic moments are represented herein as vectors) associated therewith. For example, some conventional MRAMs have a bit magnetic region 15 that is a single ferromagnetic layer, and some conventional MRAMs have a bit magnetic region 15 that is a multilayered unbalanced synthetic antiferromagnetic region. The bit magnetic region 15 and reference magnetic region 17 are positioned adjacent to the tunneling barrier 16, on opposite sides thereof. A resistance of the MTJD is determined by the relative polarities of a bit magnetic moment and a reference magnetic moment. The bit magnetic moment is positioned where the bit magnetic region 15 is adjacent to the tunneling barrier 16. The reference magnetic moment is positioned where the reference magnetic region 17 is adjacent to the tunneling barrier 16. The magnetic moment is a physical property of ferromagnetic materials. The magnetic material and the relative angle of polarization of region 15 or 17 directly adjacent to the tunnel barrier determine the high or low state. In the embodiments described herein, the bit magnetic region is a free ferromagnetic region, meaning that the bit magnetic moment is free to rotate in the presence of an applied magnetic field. The bit magnetic moment has two stable polarities (states) in the absence of any applied magnetic fields along a magnetic axis, known herein as the "bit easy axis", determined at the time of deposition of the magnetic material and fabrication of the magnetic regions 15 of the MRAM array 3. An axis orthogonal to the bit easy axis is known as the "hard axis".

Figure 2:
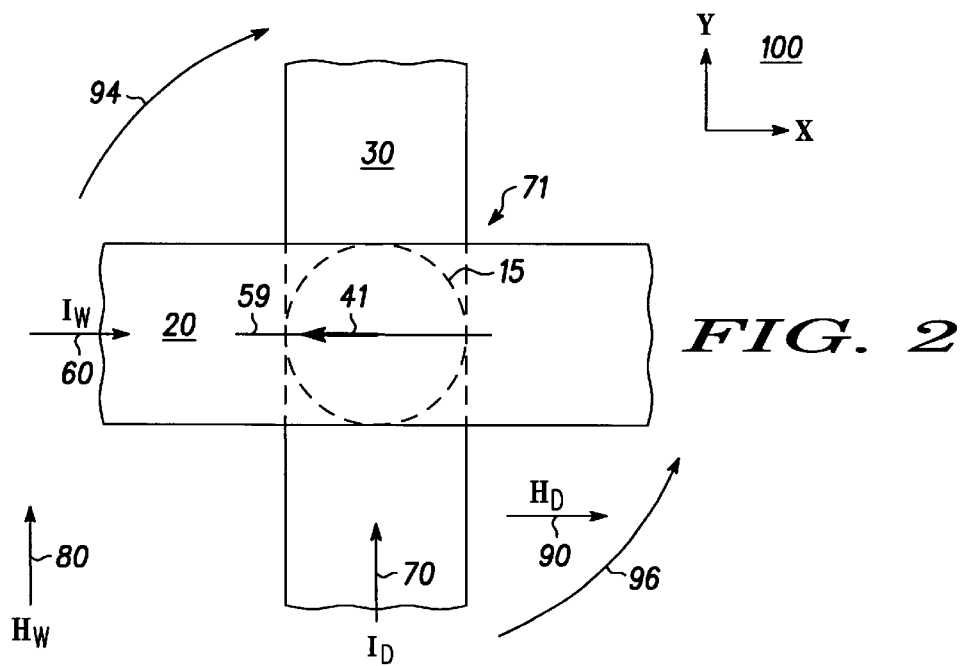
FIG. 2 is a simplified plan view of a MRAM device, showing word and digit lines, in accordance with embodiments of the present invention having a conventional bit magnetic region.

Referring to FIG. 2, a simplified plan view of a portion of an MRAM array 4 that includes an MRAM device 71 is shown, in accordance with embodiments of the present invention that include a conventional bit magnetic region 15. MRAM device 71 has the structure described with reference to FIG. 1, with a refined description that the bit magnetic region 15 in MRAM device 71 is a conventional structure having bit magnetic moment 41. Bit magnetic region 15 is shown as having an essentially circular shape in the MRAM 4 of FIG. 2, but may alternatively have another shape, such as an ellipse, that has an aspect ratio substantially greater than 1. Bit magnetic moment 41 is oriented along an anisotropic bit easy axis 59 in a direction that is essentially parallel to a writing conductor that is, in this example, the word line 20. To simplify the description of MRAM device 71, all directions will be referenced to an x- and y-coordinate system 100 as shown and to a clockwise rotation direction 94 and a counter-clockwise rotation direction 96. In MRAM 4, a word current 60 is defined as being positive if flowing in a positive x-direction and a digit current 70 is defined as being positive if flowing in a positive y-direction. The purpose of word line 20 and digit line 30 is to create an applied magnetic field within MRAM device 10. A positive word current 60 will induce a circumferential word magnetic field, $H_W$ 80, and a positive digit current 70 will induce a circumferential digit magnetic field, $H_D$ 90. Since word line 20 is above MRAM device 10, in the plane of the element, $H_W$ 80 will be applied to MRAM device 10 in the positive y-direction for a positive word current 60. Similarly, since digit line 30 is below MRAM device 10, in the plane of the element, $H_D$ 90 will be applied to MRAM device 10 in the positive x-direction for a positive digit current 70. It will be understood that the definitions for positive and negative current flow are arbitrary and are defined here for illustrative purposes. The effect of reversing the current flow is to change the direction of the magnetic field induced within MRAM device 10. The behavior of a current induced magnetic field is well known to those skilled in the art and will not be elaborated upon further here. Information is stored in bit magnetic region 15 in a conventional manner, using the word line 20 and digit line 30 simultaneously to generate the applied field that switches the bit magnetic moment to an appropriate one of the two polarities along the bit easy axis.

Figure 3:
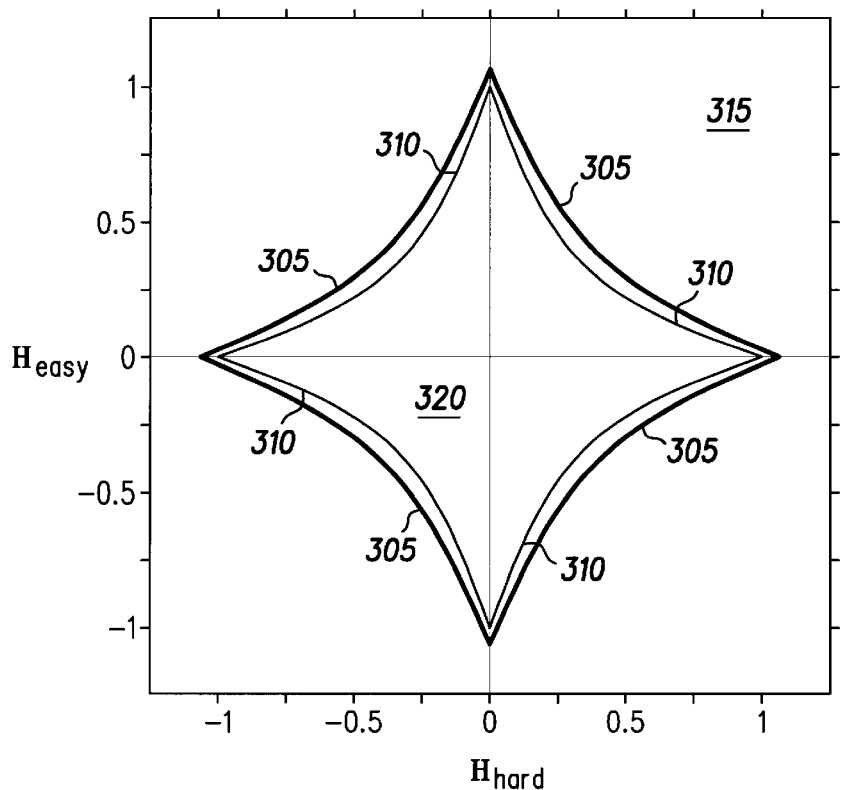
FIG. 3 is a graph showing values of an applied magnetic field that produce a switching of the polarity of the bit magnetic moment in the MRAM device described with reference to FIG. 2.

Referring to FIG. 3, a graph is shown that characterizes the applied magnetic field needed to switch the polarity of the bit magnetic moment 41 in a typical conventional MRAM device 71 having a single layer bit magnetic region 15. The horizontal axis, HHARD, of the graph shows the magnitude of the component of the applied magnetic field in the hard axis and the vertical axis, HEASY, of the graph shows the magnitude of the applied magnetic field in the bit easy axis There exists a magnetic field region 315 of operation of the applied magnetic field that is outside a switching limit 305 for which the polarity of the bit magnetic moment 41 is assured to switch in all good MRAM devices 71 in an MRAM array 4. Similarly, there exists a magnetic field region 320 of operation of the applied magnetic field that is inside a non-switching limit 310 for which the polarity of the bit magnetic moment 41 is assured not to switch in all good MRAM devices 71 in the MRAM array 4. (For any single experiment on an MRAM device 71, the limits 305, 310 merge into a single line). The magnetic field regions 315, 320 have a conventional astroid shape. Information is read from the bit magnetic region 15 using reference magnetic region 17 as described in more detail below with reference to FIGS. 13–22.

Figure 4:
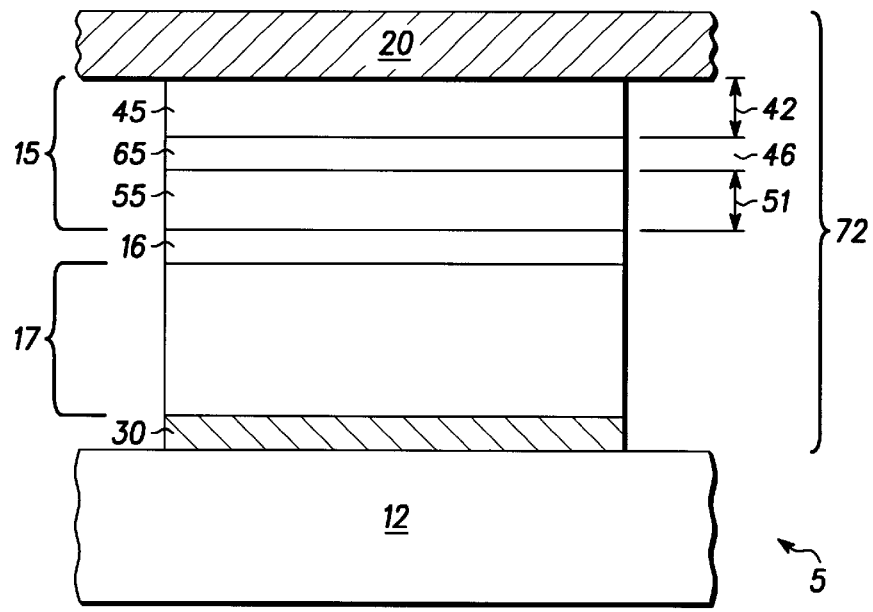
FIG. 4 is a simplified cross-sectional view of an MRAM device, in accordance with embodiments of the present invention that use a Savtchenko writing technique.

Referring to FIG. 4, a cross sectional view of a portion of an MRAM array 5 that includes an MRAM device 72 is shown, in accordance with embodiments of the present invention that use a Savtchenko writing technique described herein in some detail with reference to FIGS. 4–13. MRAM device 72 has the structure described with reference to FIG. 1, with a refined description that the bit magnetic region 15 comprises at least three layers and has magnetic moments implemented as with reference to FIGS. 4–13. (The reference magnetic region 17 is described in more detail below with reference to FIGS. 14–25). Bit magnetic region 15 in this example is a tri-layer structure, which has an anti-ferromagnetic coupling spacer layer 65 sandwiched between two ferromagnetic layers 45 and 55, providing what is known as a synthetic anti-ferromagnetic (hereinafter referred to as "SAF") layer. Anti-ferromagnetic coupling spacer layer 65 has a thickness 46 and ferromagnetic layers 45 and 55 have thicknesses 42 and 51, respectively.

Anti-ferromagnetic coupling spacer layer 65 preferably includes at least one of the elements Ru, Os, Re, Cr, Rh, Cu, Nb, Mo, Ta, W, Ir, V or combinations thereof, and is not by itself an anti-ferromagnetic material; rather it is a coupling layer that is key to creating the anti-ferromagnetic-like properties of the SAF layer. Further, ferromagnetic layers 45, 55 include at least one of elements Ni, Fe, Co, or combinations thereof. Also, it will be understood that bit magnetic region 15 can include synthetic anti-ferromagnetic layer material structures other than tri-layer structures and the use of tri-layer structures in this embodiment is for illustrative purposes only. For example, one such synthetic anti-ferromagnetic layer material structure could include a five-layer stack of a ferromagnetic layer/anti-ferromagnetic coupling spacer layer/ferromagnetic layer/anti-ferromagnetic coupling spacer layer/ferromagnetic layer structure. The number of ferromagnetic layers is identified as N.

Ferromagnetic layers 45, 55 have magnetic moments 58 and 53 (see FIG. 5), respectively, that have respective vector values $M_1$ and $M_2$. The written state of the bit magnetic region 15 is determined by the magnetic moment 58 that is adjacent to the tunneling barrier 16. For the purposes of explaining the Savtchenko writing technique there is also defined a net magnetic moment 40 that is the vector resultant of the magnetic moments 58 and 53. The magnetic moments 58, 53 are usually oriented anti-parallel by the coupling of the anti-ferromagnetic coupling spacer layer 65. Anti-ferromagnetic coupling is also generated by the magnetostatic fields of the layers in the MRAM device 72. Therefore, the spacer layer 65 need not necessarily provide any additional anti-ferromagnetic coupling beyond eliminating the ferromagnetic coupling between the two ferromagnetic layers 45, 55 and could therefore be an insulator such as A/O or a conductor such as Ta or Cu.

The magnetic moments 58, 53 in the two ferromagnetic layers 45, 55 in the MRAM device 72 can have different thicknesses or material to provide a net magnetic moment 40 given by $\Delta M = (M_2 - M_1)$. In this case of Savtchenko writing technology, this tri-layer structure will be nearly balanced; that is, $\Delta M$ is quite small or zero when there is no applied field. The magnetic moments of the tri-layer structure of the bit magnetic region 15 are free to rotate with an applied magnetic field. In zero field the bit magnetic moment 58, which is the magnetic moment that is adjacent to the tunneling barrier 16, will be stable in one of two polarized directions along the easy axis.

A measurement current through the MRAM device 72 that is used to read the polarity of the bit magnetic moment 58 depends on the tunneling magnetoresistance, which is governed by the orientation and magnitudes of the bit magnetic moment 58 and a reference magnetic moment of the reference magnetic region 17. When these two magnetic moments are parallel, then the MRAM device resistance is low and a voltage bias will induce a larger measurement current through the MRAM device 72. This state is defined as a "1". When these two magnetic moments are anti-parallel, then the MRAM device resistance is high and an applied voltage bias will induce a smaller measurement current through the device. This state is defined as a "0". It will be understood that these definitions are arbitrary and could be reversed, but are used in this example for illustrative purposes. Thus, in magnetoresistive memory, data storage is accomplished by applying magnetic fields that cause the magnetic moments in region 15 to be orientated either one of parallel and anti-parallel directions along the bit easy axis 59 relative to region 17, and reading the written state relies upon resistance measurements that depend on the polarity of the bit magnetic moment relative to the reference magnetic moment (This same operation is true for all of the MRAM devices described herein)

The method of writing to the MRAM device 72 relies on the phenomenon of "spin-flop" for a nearly balanced SAF tri-layer structure, which is well known to one of ordinary skill in the art. Here, the term "nearly balanced" is defined such that the M1 and M2 are within 10% of one another. The "spin-flop" phenomenon lowers the total magnetic energy in an applied field by rotating the magnetic moments of the ferromagnetic layers so that they are nominally orthogonal to the applied field direction but still predominantly anti-parallel to one another. The rotation, or "flop", combined with a small deflection of each ferromagnetic magnetic moment in the direction of the applied field accounts for the decrease in total magnetic energy.

While anti-ferromagnetic coupling layers are illustrated between the two ferromagnetic layers in the tri-layer structure of this example, it will be understood that the ferromagnetic layers could be anti-ferromagnetically coupled through other means, such as magnetostatic fields or other features. For example, when the aspect ratio of a cell is reduced to five or less, the ferromagnetic layers are anti-parallel coupled from magnetostatic flux closure.

MRAM device 72 preferably has tri-layer structure that has a non-circular shape characterized by a length/width ratio in a range of 1 to 5. It will be understood that the bit magnetic region 15 of MRAM device 72 can have other shapes, such as square, elliptical, rectangular, or diamond, but it is illustrated as being circular for simplicity.

Further, during fabrication of MRAM array 5, each succeeding layer (i.e. 30, 55, 65, etc.) is deposited or otherwise formed in sequence and each MRAM device 72 may be defined by selective deposition, photolithography processing, etching, etc. in any of the techniques known in the semiconductor industry. During deposition of at least the ferromagnetic layers 45 and 55, a magnetic field is provided to set the bit easy axis. The provided magnetic field creates a preferred anisotropy axis for magnetic moments 53 and 58. The bit easy axis 59 is chosen to be at a 45° angle between word line 20 and digit line 30.

Figure 5:
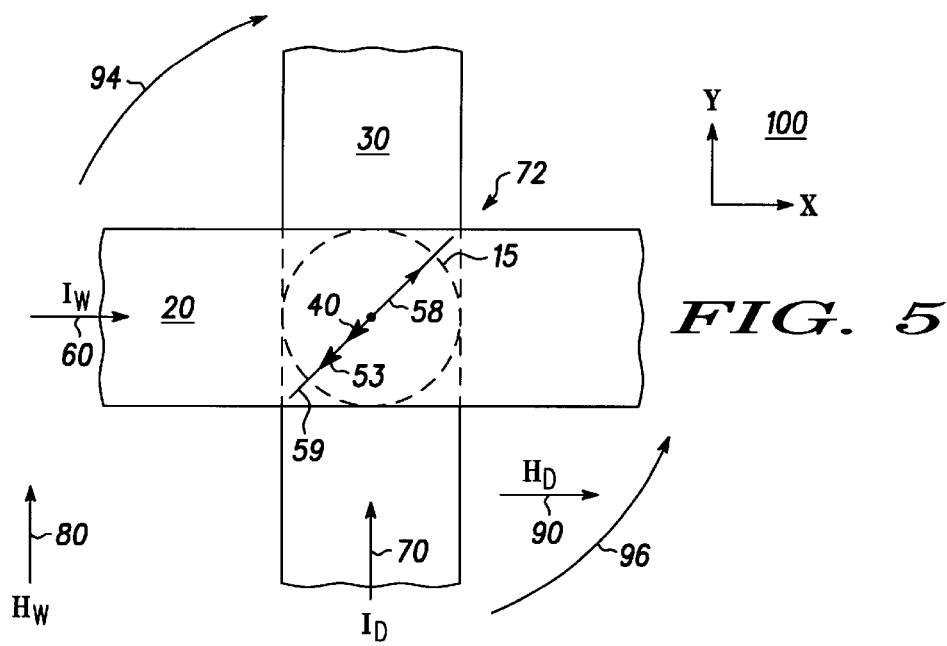
FIG. 5 is a simplified plan view of part of the MRAM device described with reference to FIG. 4, showing word and digit lines.

Referring to FIG. 5, a simplified plan view of parts of the MRAM array 5 is shown, in accordance with embodiments of the present invention described with reference to FIG. 3. The x- and y-coordinate system 100, rotational directions 94, 96, and field and polarity definitions related to the word current 60 and digit current 70 are the same as in FIG. 2. To simplify the description, it is assumed that N is equal to two so that MRAM device 72 includes one tri-layer structure in bit magnetic region 15 with magnetic moments 53 and 58, as well as a net magnetic moment 40. Also, only the magnetic moments of bit magnetic region 15 are illustrated.

To illustrate how the writing methods for the MRAM array 5 work, it is assumed that a preferred anisotropy axis for magnetic moments 53 and 58 is directed at a 45° angle relative to the negative x- and negative y-directions and at a 45° angle relative to the positive x- and positive y-directions. As an example, FIG. 4 shows that magnetic moment 53 is directed at a 45° angle relative to the negative x- and negative y-directions. Since magnetic moment 58 is generally oriented anti-parallel to magnetic moment 53, it is directed at a 45° angle relative to the positive x- and positive y-directions. This initial orientation will be used to show examples of the writing methods, as will be discussed presently.

Figure 6:
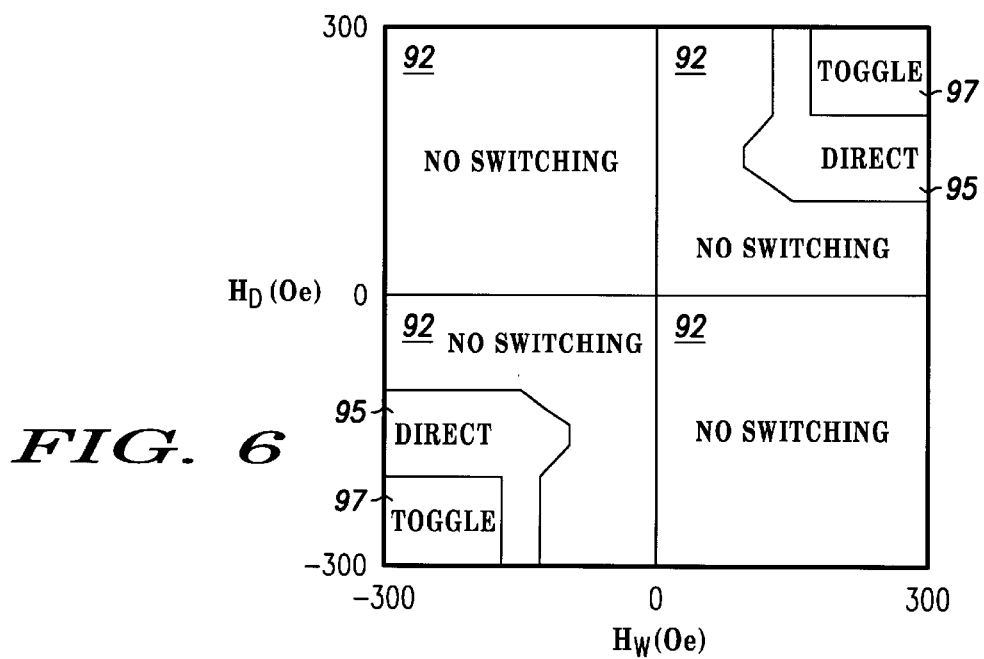
FIG. 6 is a graph showing results of a simulation of the magnetic field amplitude combinations that produce the direct or toggle write mode in the MRAM device described with reference to FIG. 4.
Figure 7:
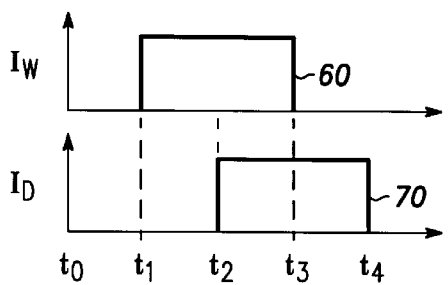
FIG. 7 is a timing graph showing the word current and the digit current of the MRAM device described with reference to FIG. 4.

Referring to FIG. 6, a graph shows results of a simulated switching behavior of the SAF tri-layer structure of bit magnetic region 15. The simulation uses two single domain magnetic layers that have close to the same moment (a nearly balanced SAF) with an intrinsic anisotropy, are coupled anti-ferromagnetically, and whose magnetization dynamics are described by the well known Landau-Lifshitz equation. The x-axis is the word line magnetic field amplitude in Oersteds, and the y-axis is the digit line magnetic field amplitude in Oersteds. The magnetic fields are applied in a pulse sequence 600 as shown in a timing graph in FIG. 7. The pulse sequence 600 includes word current 60 and digit current 70 as functions of time.

There are three magnetic field regions of operation illustrated in FIG. 6. In a magnetic field region 92 there is no switching. For MRAM operation in a magnetic field region 95, a direct writing method is in effect. When using the direct writing method, there is no need to determine the initial state of the MRAM device because the state is only switched if the state being written is different from the state that is stored. The selection of the written state is determined by the direction of current in both word line 20 and digit line 30. For example, if a '1' is to be written, then the direction of current in both lines will be positive. If a '1' is already stored in the element and a '1' is being written, then the final state of the MRAM device will continue to be a '1'. Further, if a '0' is stored and a '1' is being written with positive currents, then the final state of the MRAM device will be a '1'. Similar results are obtained when writing a '0' by using negative currents in both the word and digit lines. Hence, either state can be programmed to the desired '1' or '0' with the appropriate polarity of current pulses, regardless of its initial state. Throughout this disclosure, operation in magnetic field region 95 will be defined as "direct write mode".

For MRAM operation in a magnetic field region 97, a toggle writing method is in effect. When using the toggle writing method, there is a need to determine the initial state of the MRAM device before writing because the state is switched every time the MRAM device is written to, regardless of the direction of the currents as long as the same polarity current pulses are chosen for both word line 20 and digit line 30. For example, if a '1' is initially stored then the state of the device will be switched to a '0' after one positive current pulse sequence is flowed through the word and digit lines. Repeating the positive current pulse sequence on the stored '0' state returns it to a '1'. Thus, to be able to write the memory element into the desired state, the initial state of MRAM device 72 must first be read and compared to the state to be written. The reading and comparing may require additional logic circuitry, including a buffer for storing information and a comparator for comparing memory states. MRAM device 72 is then written to only if the stored state and the state to be written are different. One of the advantages of this method is that the power consumed is lowered because only the differing bits are switched. An additional advantage of using the toggle writing method is that only uni-polar voltages are required and, consequently, smaller transistors can be used to drive the MRAM device. Throughout this disclosure, operation in magnetic field region 97 will be defined as "toggle write mode".

Both writing methods involve supplying currents in word line 20 and digit line 30 such that magnetic moments 53 and 58 can be oriented in one of two preferred directions as discussed previously. To fully elucidate the two switching modes, specific examples describing the time evolution of magnetic moments 53, 58, and 40 are now given.

Figure 8:
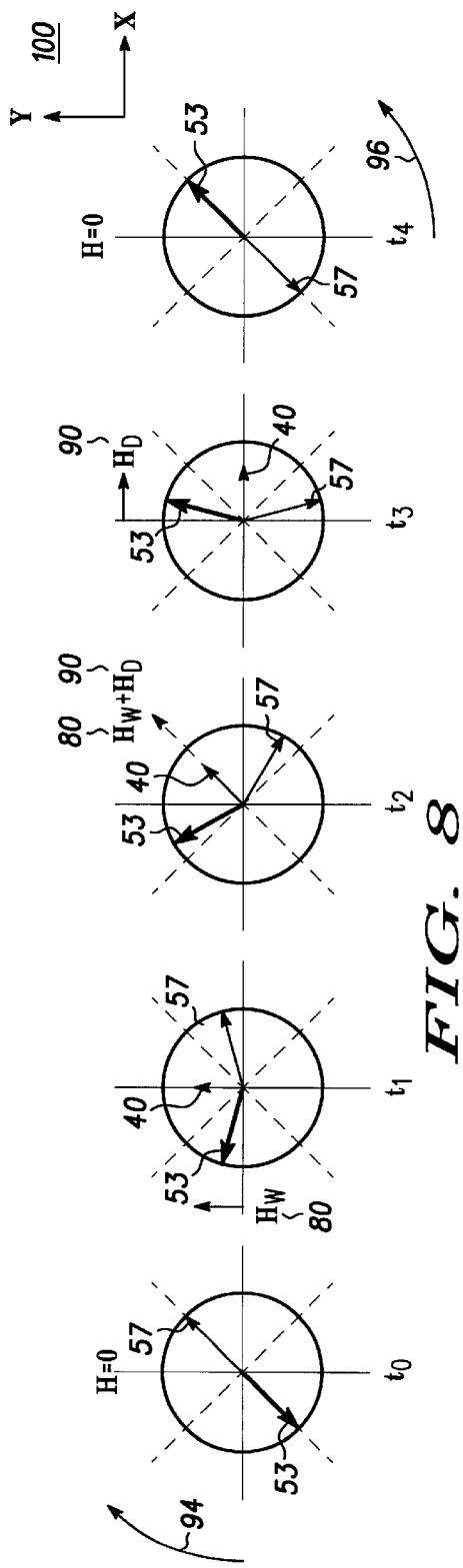
FIG. 8 is a vector diagram showing the rotation of the magnetic moments for a magnetoresistive random access memory device for the toggle write mode when writing a '1' to a '0 in the MRAM device described with reference to FIG. 4.

Referring to FIG. 8, a vector diagram shows the toggle write mode for writing a '1' to a '0' using pulse sequence 600 in MRAM device 72. In this illustration at time $t_0$, magnetic moments 53 and 58 are oriented in the preferred directions as shown in FIG. 4. This orientation will be defined as a '1'.

At a time $t_1$, a positive word current 60 is turned on, which induces $H_W$ 80 to be directed in the positive y-direction. The effect of positive $H_W$ 80 is to cause the nearly balanced anti-aligned MRAM tri-layer to "flop" and become oriented approximately 90° to the applied field direction. The finite anti-ferromagnetic exchange interaction between ferromagnetic layers 45 and 55 will allow magnetic moments 53 and 58 to now deflect at a small angle toward the magnetic field direction and net magnetic moment 40 will subtend the angle between magnetic moments 53 and 58 and will align with $H_W$ 80. Hence, magnetic moment 53 is rotated in clockwise direction 94.

Since net magnetic moment 40 is the vector addition of magnetic moments 53 and 58, magnetic moment 58 is also rotated in clockwise direction 94.

At a time $t_2$, positive digit current 70 is turned on, which induces positive $H_D$ 90. Consequently, net magnetic moment 40 is being simultaneously directed in the positive y-direction by $H_W$ 80 and the positive x-direction by $H_D$ 90, which has the effect of causing net magnetic moment 40 to further rotate in clockwise direction 94 until it is generally oriented at a 45° angle between the positive x- and positive y-directions. Consequently, magnetic moments 53 and 58 will also further rotate in clockwise direction 94.

At a time $t_3$, word current 60 is turned off so that now only $H_D$ 90 is directing net magnetic moment 40, which will now be oriented in the positive x-direction. Both magnetic moments 53 and 58 will now generally be directed at angles passed their anisotropy hard-axis instability points.

At a time $t_4$, digit current 70 is turned off so a magnetic field force is not acting upon net magnetic moment 40. Consequently, magnetic moments 53 and 58 will become oriented in their nearest preferred directions to minimize the anisotropy energy. In this case, the preferred direction for magnetic moment 53 is at a 45° angle relative to the positive y- and positive x-directions. This preferred direction is also 180° from the initial direction of magnetic moment 53 at time to and is defined as '0'. Hence, MRAM device 72 has been switched to a '0'. It will be understood that MRAM device 72 could also be switched by rotating magnetic moments 53, 58, and 40 in counter clockwise direction 96 by using negative currents in both word line 20 and digit line 30, but is shown otherwise for illustrative purposes.

Figure 9:
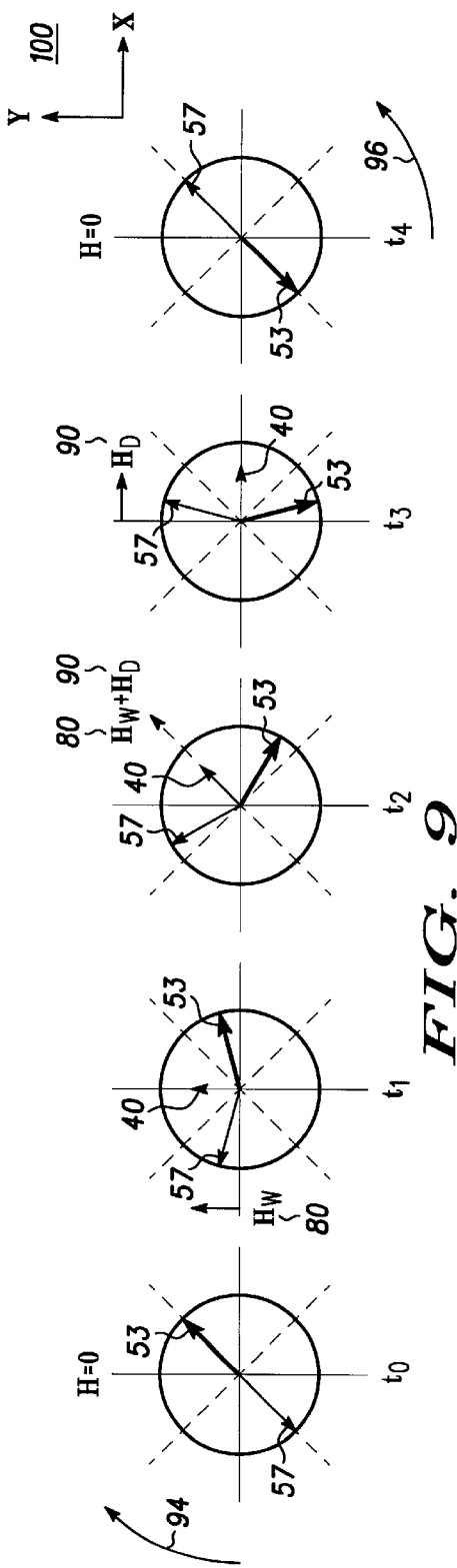
FIG. 9 is a vector diagram showing the rotation of the magnetic moments for a magnetoresistive random access memory device for the toggle write mode when writing a '0' to a '1' in the MRAM device described with reference to FIG. 4.

Referring to FIG. 9, a vector diagram shows the toggle write mode for writing a '0' to a '1' using pulse sequence 600 in MRAM device 72. Illustrated are the magnetic moments 53 and 58, as well as net magnetic moment 40, at each of the times $t_0$, $t_1$, $t_2$, $t_3$, and $t_4$ as described previously showing the ability to switch the state of MRAM device 10 from '0' to 1' with the same current and magnetic field directions. Hence, the state of MRAM device 72 is written to with toggle write mode, which corresponds to magnetic field region 97 in FIG. 6.

For the direct write mode, it is assumed that magnetic moment 53 is larger in magnitude than magnetic moment 58, so that magnetic moment 40 points in the same direction as magnetic moment 53, but has a smaller magnitude in zero field. This unbalanced moment allows the dipole energy, which tends to align the total moment with the applied field, to break the symmetry of the nearly balanced SAF. Hence, switching can occur only in one direction for a given polarity of current.

Figure 10:
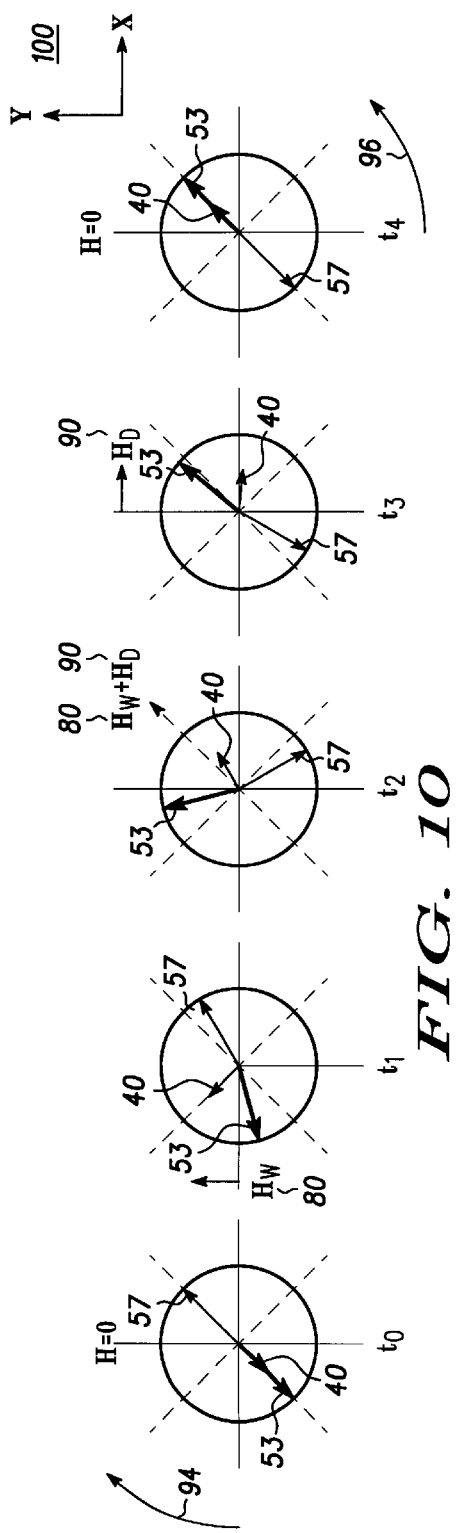
FIG. 10 is a vector diagram showing the rotation of the magnetic moments for a magnetoresistive random access memory device for the direct write mode when writing a '1' to a '0' in the MRAM device described with reference to FIG. 4.

Referring to FIG. 10, a vector diagram shows an example of writing a '1' to a '0', using the direct write mode using pulse sequence 600 in MRAM device 72. Here again, the memory state is initially a '1' with magnetic moment 53 directed 45° with respect to the negative x- and negative y-directions and magnetic moment 58 directed 45° with respect to the positive x- and positive y-directions. Following the pulse sequence as described above with positive word current 60 and positive digit current 70, the writing occurs in a similar manner as the toggle write mode as described previously. Note that the moments again 'FLOP' at a time $t_1$, but the resulting angle is canted from 90° due to the unbalanced moment and anisotropy. After time $t_4$, MRAM device 10 has been switched to the '0' state with net magnetic moment 40 oriented at a 45° angle in the positive x- and positive y-directions as desired. Similar results are obtained when writing a '0' to a '1' only now with negative word current 60 and negative digit current 70.

Figure 11:
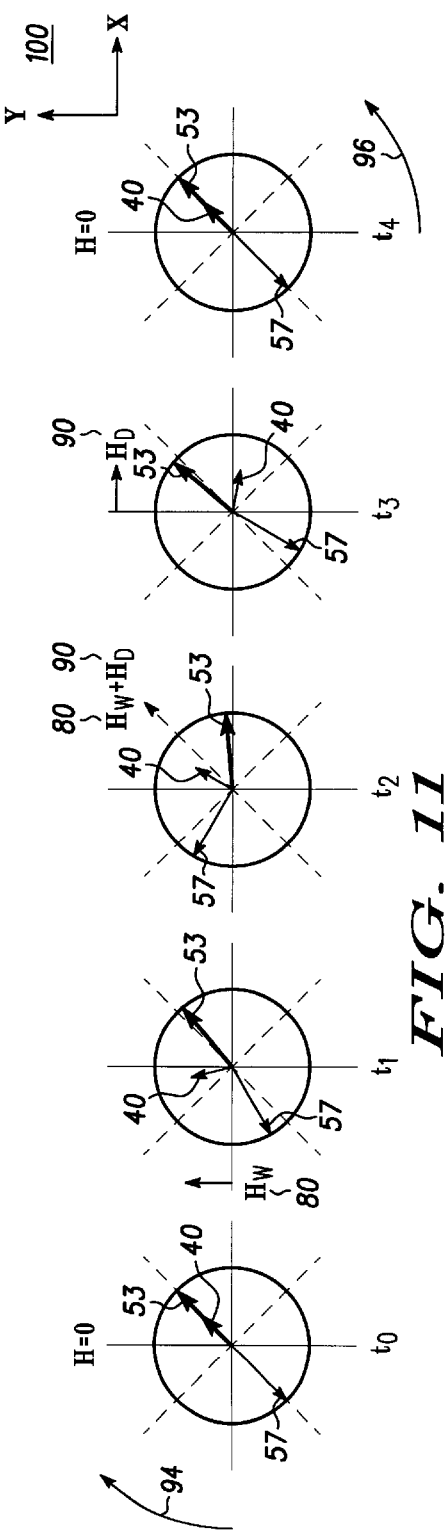
FIG. 11 is a vector diagram showing the rotation of the magnetic moments for a magnetoresistive random access memory device for the direct write mode when writing a '0' to a state that is already a '0' in the MRAM device described with reference to FIG. 4.

Referring to FIG. 11, a vector diagram shows the magnetic moments rotations in MRAM device 72 for an example of writing using the direct write mode when the new state is the same as the state already stored. In this example, a '0' is already stored in MRAM device 72 and current pulse sequence 600 is now repeated to store a '0'. Magnetic moments 53 and 58 attempt to "flop" at a time $t_1$, but because the unbalanced magnetic moment must work against the applied magnetic field, the rotation is diminished. Hence, there is an additional energy barrier to rotate out of the reverse state. At time $t_2$, the dominant moment 53 is nearly aligned with the positive x-axis and less than 45° from its initial anisotropy direction. At a time $t_3$, the magnetic field is directed along the positive x-axis. Rather than rotating further clockwise, the system now lowers its energy by changing the SAF moment symmetry with respect to the applied field. The passive moment 58 crosses the x-axis and the system stabilizes with the dominant moment 53 returned to near its original direction. Therefore, at a time t4 when the magnetic field is removed, and the state stored in MRAM device 72 will remain a '0'. This sequence illustrates the mechanism of the direct write mode shown as magnetic field region 95 in FIG. 6. Hence, in this convention, to write a '0' requires positive current in both word line 20 and digit line 30 and, conversely, to write a '1' negative current is required in both word line 20 and digit line 30.

If larger fields are applied, eventually the energy decrease associated with a flop exceeds the additional energy barrier created by the dipole energy of the unbalanced moment which is preventing a toggle event. At this point, a toggle event will occur and the switching is described by magnetic field region 97.

Magnetic field region 95, in which the direct write mode applies, can be expanded, i.e. toggle mode magnetic field region 97 can be moved to higher magnetic fields, if the times $t_3$ and $t_4$ are equal or made as close to equal as possible. In this case, the magnetic field direction starts at 45° relative to the bit anisotropy axis when word current 60 turns on and then moves to parallel with the bit anisotropy axis when digit current 70 turns on. This example is similar to the typical magnetic field application sequence. However, now word current 60 and digit current 70 turn off substantially simultaneously, so that the magnetic field direction does not rotate any further. Therefore, the applied field must be large enough so that the net magnetic moment 40 has already moved past its hard-axis instability point with both word current 60 and digit current 70 turned on. A toggle writing mode event is now less likely to occur, since the magnetic field direction is now rotated only 45°, instead of 90° as before. An advantage of having substantially coincident fall times, $t_3$ and $t_4$, is that now there are no additional restrictions on the order of the field rise times $t_0$ and $t_2$. Thus, the magnetic fields can be turned on in any order or can also be substantially coincident.

Figure 12:
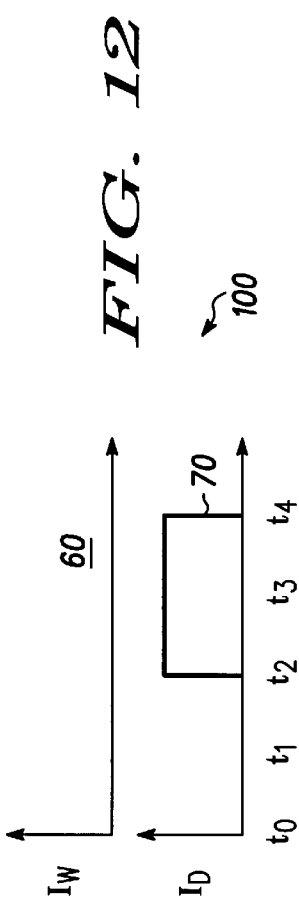
FIG. 12 is a timing graph of the word current and the digit current when only the digit current is turned on in the MRAM device described with reference to FIG. 4.
Figure 13:
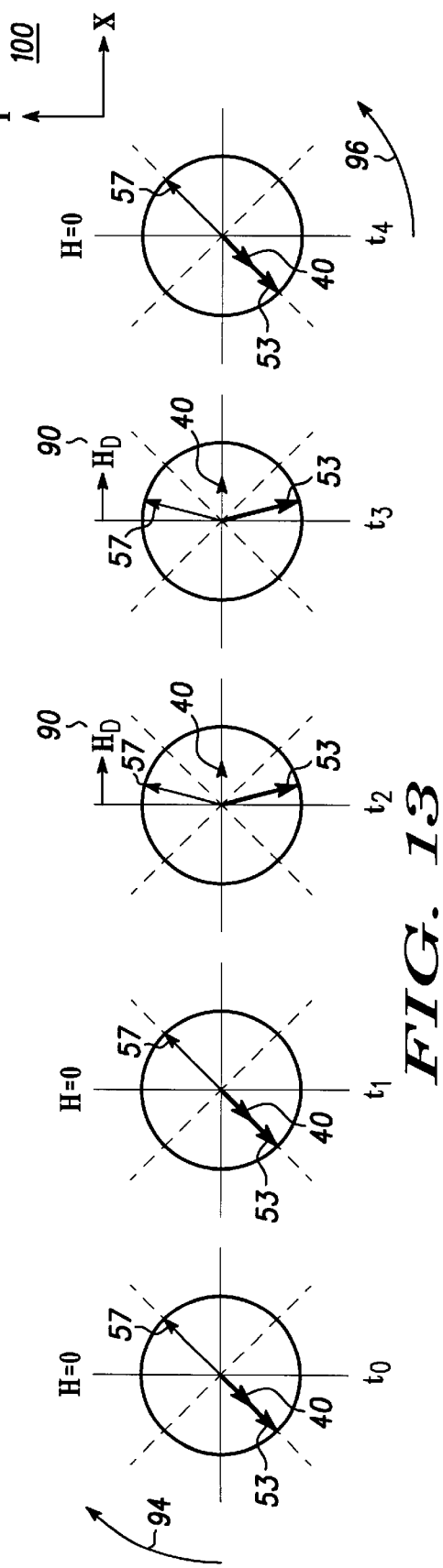
FIG. 13 is a vector diagram showing the rotation of the magnetic moments for a magnetoresistive random access memory device when only the digit current is turned on in the MRAM device described with reference to FIG. 4.

The writing methods described with reference to FIGS. 4–13, herein called the Savtchenko writing technique, are highly selective because only the MRAM device that has both word current 60 and digit current 70 turned on between time $t_2$ and time $t_3$ will switch states. This feature is illustrated in FIGS. 12 and 13. FIG. 12 is a timing graph that shows a pulse sequence 600 used in MRAM device 72 when word current 60 is not turned on and digit current 70 is turned on. FIG. 13 is a vector diagram that shows the corresponding behavior of the state of MRAM device 72. At a time $t_0$, magnetic moments 53 and 58, as well as net magnetic moment 40, are oriented as described in FIG. 5. In pulse sequence 600, digit current 70 is turned on at a time $t_1$. During this time, $H_D$ 90 will cause net magnetic moment 40 to be directed in the positive x-direction.

Since word current 60 is never switched on, magnetic moments 53 and 58 are never rotated through their anisotropy hard-axis instability points. As a result, magnetic moments 53 and 58 will reorient themselves in the nearest preferred direction when digit current 70 is turned off at a time t₃, which in this case is the initial direction at time t₀. Hence, the state of MRAM device 72 is not switched. It will be understood that the same result will occur if word current 60 is turned on at similar times described above and digit current 70 is not turned on. Furthermore, it will be understood that even if both the word current 60 and the digit current 70 are both turned on simultaneously, with non-varying magnitudes, the same result will occur. This feature ensures that only one MRAM device in an array will be switched, while the other devices will remain in their initial states. As a result, unintentional switching is avoided and the bit error rate is minimized. Thus, in an approach analogous to that used for the MRAM device 71 described with reference to FIGS. 2 and 3, a non-switching value for MRAM device 72, there is a region of values for the applied magnetic field within which there is assurance that the bit magnetic moment will not be rotated from one stable polarity to another in the bit easy axis 59. This region of values corresponds to the magnetic field region 92 described with reference to FIG. 6, although it will be appreciated that the size of the non-switching magnetic field region for an MRAM being commercially distributed will be slightly smaller than the illustrated size of the magnetic field region as simulated for one device, to account for manufacturing variations. In contrast to the conventional non-switching magnetic field region as shown in FIG. 3 an MRAM device using the Savtchenko technology of switching the bit magnetic moment is substantially less sensitive to fields generated by only one of two orthogonal current lines.

Referring to FIG. 14, a cross sectional view of a portion of an MRAM array 6 that includes an MRAM device 73 is shown, in accordance with embodiments of the present invention wherein the bit magnetic region 15 comprises any one of the structures described herein in with reference to FIG. 2 and with reference to FIGS. 4–6. Furthermore, reference magnetic region 17 in MRAM device 73 is a pinned magnetic layer providing the reference magnetic moment, comprising a ferromagnetic layer 81 that is adjacent to the electrically insulating material forming the tunneling barrier 16, and an anti-ferromagnetic layer 82 adjacent to the ferromagnetic layer 81. Anti-ferromagnetic layer 82 preferably includes an anti-ferromagnetic material such as iron-manganese, iridium manganese, or platinum-manganese alloys. Ferromagnetic layer 81 includes at least one of elements Ni, Fe, Co, or combinations thereof.

FIGS. 15–18 are used to describe the read operation of the MRAM device 73. Referring to FIG. 15, a plan view of the MRAM device 73 is shown, in accordance with this embodiment of the present invention. The bit magnetic region 15 is shown with an aspect ratio that is substantially greater than 1 for clarity and corresponds to the conventional bit magnetic region 15 of MRAM device 71 as described with reference to FIG. 2, or the Savtchenko bit magnetic region 15 of MRAM device 72 as described with reference to FIGS. 4–6, and gives rise to a bit easy axis 1435 in which lie two stable values of the bit magnetic moment. It will be appreciated that there are other ways to achieve the anisotropy that gives rise to the bit easy axis 1435. The reference magnetic region 17 has a low aspect ratio to reduce the shape anisotropy, and has a reference magnetic moment 1430 that is substantially orthogonal to the bit easy axis 1435 when a component 1410 of an applied magnetic field that is in the bit easy axis 1435 has a magnitude of zero. The low aspect ratio is preferably in a range from 0.8 to 1.2, but could be other values that are near 1, i.e., in a range from 0.6 to 1.4. The reference magnetic moment 1430 orientation results in a magnetoresistance identified herein as a reference magnetoresistance 1510 when the applied magnetic field that is in the bit easy axis 1435 has a magnitude of zero. The substantially orthogonal orientation of the reference magnetic moment 1430 under conditions of no applied magnetic field is established during the fabrication of the reference magnetic region 17, in a manner well known to one of ordinary skill in the art. The polarity 1425 of the bit magnetic moment in the example shown in FIG. 15 is defined to be a "0" state. Referring to FIG. 16, a graph of the magnetoresistance of the MRAM device 73 versus the component of the applied magnetic field in the bit easy axis 1435 is shown for the example described in FIG. 15. When the component 1410 of the applied magnetic field in the bit easy axis 1435 is at a sense value that is within the non-switching magnetic field region associated with a particular embodiment of the bit magnetic region 15 (e.g., magnetic field region 320 as described with reference to FIG. 3 and magnetic field region 92 as described with reference to FIG. 6), the reference magnetic moment is rotated 1440 by the applied magnetic field and the magnetoresistance of the MRAM device 73 changes from the reference magnetoresistance 1510 to a first sense value of magnetoresistance 1520 that is less than the reference magnetoresistance 1510, because the polarity of the component of the rotated reference magnetic moment 1425 that is in the bit easy axis 1435 opposes the polarity 1440 of the bit magnetic moment in the "0" state. This change of magnetoresistance has a negative sign.

Referring to FIG. 17, another plan view of the MRAM device 73 is shown, in accordance with this embodiment of the present invention. In this example, everything is the same as described with reference to FIG. 15, except that the polarity 1625 of the bit magnetic moment is defined to be a "1" state. Referring to FIG. 18, a graph of the magnetoresistance of the MRAM device 73 versus the component of the applied magnetic field in the bit easy axis 1435 is shown for the example described in FIG. 17. Now, when the component 1410 of the applied magnetic field in the bit easy axis 1435 is at the sense value, the reference magnetic moment is rotated 1440 by the applied magnetic field and the magnetoresistance of the MRAM device 73 changes from the reference magnetoresistance 1510 to a second sense value of magnetoresistance 1720 that is greater than the reference magnetoresistance 1510, because the polarity of the component of the rotated reference magnetic moment 1425 that is in the bit easy axis 1435 is congruent to the polarity 1440 of the bit magnetic moment in the "0" state. This change of magnetoresistance has a positive sign.

The applied magnetic field for the read operation is designed and implemented in conjunction with a pinning strength of the reference magnetic moment 1430 so that the state (polarity) of the bit magnetic moment is reliably indicated by a sign of a change of the magnetoresistance of the MRAM device 73 from the reference magnetoresistance 1510 when the sense value of the applied magnetic field is used. In general, the pinning strength of the reference magnetic moment 1430 is reduced below the pinning strength of conventional "fixed" reference magnetic moments by choices of materials and fabrication process parameters for the anti-ferromagnetic layer 82 and the ferromagnetic layer 81 so that when the applied magnetic field is at the selected sense value (that is within a non-switching magnetic field region 320 (FIG. 3), 92 (FIG. 6)), the reference magnetic moment rotates sufficiently to induce the reliable sign change of the magnetoresistance of the tunneling barrier 16. Thus, a reliable invention has been described that avoids the issues associated with determining the state of the stored bit magnetic moment using external references as is done in prior art MRAMs. The MRAM device 73 is preferably embodied using the Savtchenko technology for the bit magnetic region 15, as described with reference to FIGS. 4–13. This is due to the lesser sensitivity, during the read operation, of the Savtchenko technology bit magnetic moment to a constant applied magnetic field than for conventional technologies. It will be appreciated that for the Savtchenko technology, in which the word and digit lines 20, 30 are preferably oriented 45 degrees with reference to the bit easy axis 1435, current is applied during a read operation along either current lines 20 and 30 or both to achieve a component of the field along the easy axis. However, the bit magnetic moment will not be switched to a new polarity in response to the applied magnetic field because a particular pulse sequence is needed to toggle the bit magnetic moment, as described with reference to FIGS. 8–11. In a first alternative approach when the Savtchenko technology is used for the bit magnetic region 15 and writing operation, only one of the word and digit lines 20, 30 is energized to create an applied magnetic field that has sufficient magnitude in the bit easy axis 1435 to effect a reliable read operation. In a second alternative approach, a separate read line (a third current line) that is orthogonal to the bit easy axis 1435 could be included for each MRAM device 73, so that an applied magnetic field generated only by current in the read line has substantially all of its field in one of two polarities along the bit easy axis 1435. As for the word line 20 and digit line 30, the read line need only be near the reference magnetic region 17 to which the magnetic field is to be applied.

Referring to FIG. 19, a cross sectional view of a portion of an MRAM array 7 that includes an MRAM device 74 is shown, in accordance with embodiments of the present invention wherein (as for MRAM device 74) the bit magnetic region 15 comprises any one of the structures described herein with reference to FIG. 2 and with reference to FIGS. 4–6. Reference magnetic region 17 in MRAM device 74 comprises a synthetic anti-ferromagnetic (SAF) layer 83 that is adjacent to the electrically insulating material forming the tunneling barrier 16, and further comprises a pinning anti-ferromagnetic layer 57 adjacent to the SAF tri-layer structure 83. The SAF tri-layer structure 83 comprises three layers: a ferromagnetic layer 46, an anti-ferromagnetic coupling layer 66 (also called more simply the coupling layer 66), and a ferromagnetic layer 56. These three layers 46, 66, 56 preferably comprise materials chosen from the same respective materials from which layers 45, 65, 55 are chosen for the MRAM device 72 described with reference to FIG. 4. The anti-ferromagnetic pinning layer 57 comprises an anti-ferromagnetic material such as iron-manganese, iridium manganese, or platinum-manganese alloys. The read operation of MRAM device 74 is identical to the read operation of MRAM device 73. Referring again to FIGS. 15–18, the bit magnetic region 15 is shown with an aspect ratio that is preferably in a range from 1.5 to 3.0, but may be any value greater than 1, and corresponds to the conventional bit magnetic region 15 of MRAM device 71 as described with reference to FIG. 2, or the Savtchenko bit magnetic region 15 of MRAM device 72 as described with reference to FIGS. 4–6, and gives rise to a bit easy axis 1435 in which lie two stable values of the bit magnetic moment. It will be appreciated that there are other ways to achieve the anisotropy that gives rise to the bit easy axis 1435. The reference magnetic region 17 has a low aspect ratio near 1 (as described above) to reduce the shape anisotropy to near zero, and has a reference magnetic moment 1430 that is substantially orthogonal to the bit easy axis 1435 when a component 1410 of an applied magnetic field that is in the bit easy axis 1435 has a magnitude of zero.

The applied magnetic field for the read operation is designed and implemented in conjunction with a rotational response strength of the reference magnetic moment 1430 so that the state (polarity) of the bit magnetic moment is reliably indicated by a sign of a change of the magnetoresistance of the MRAM device 73 from the reference magnetoresistance 1510 when a sense value of the applied magnetic field is used that is within the non-switching magnetic field region associated with a particular embodiment of the bit magnetic region 15 (e.g., magnetic field region 320 as described with reference to FIG. 3 and magnetic field region 92 as described with reference to FIG. 6). In this embodiment of the MRAM device 74, the materials and process implementation steps for the anti-ferromagnetic pinning layer 57 are designed and implemented to fabricate a layer having a strong pinning strength—that is layer 57 is a strong pinning layer. The rotational response strength of the reference magnetic moment 1430 is reduced below the rotational strength of conventional "fixed" reference magnetic moments by choices of materials and fabrication process parameters for the SAF tri-layer structure 83. These choices can include designing and implementing a weak anti-ferromagnetic coupling layer 66 or a moment imbalance of ferromagnetic layers 46, 56, or some combination of the two characteristics such that the magnetic moment of layer 46 (the reference magnetic moment 1430) will rotate in response to the applied magnetic (sensing) field while the magnetic moment of layer 56 remains fixed. Thus, a reliable invention has been described that avoids the issues associated with determining the state of the stored bit magnetic moment using external references as is done in prior art MRAMs. The MRAM device 74 is preferably embodied using the Savtchenko technology for the bit magnetic region 15, as described with reference to FIGS. 4–13, for the same reasons as described for MRAM device 73. Thus, as in the MRAM device 73, one or both of the word and digit lines 20, 30 can be used to generate the applied magnetic field used to read the stored bit magnetic moment, or a third line could be added for this purpose, depending on the technology of the bit magnetic region 15 and the write operation.

Figure 20:
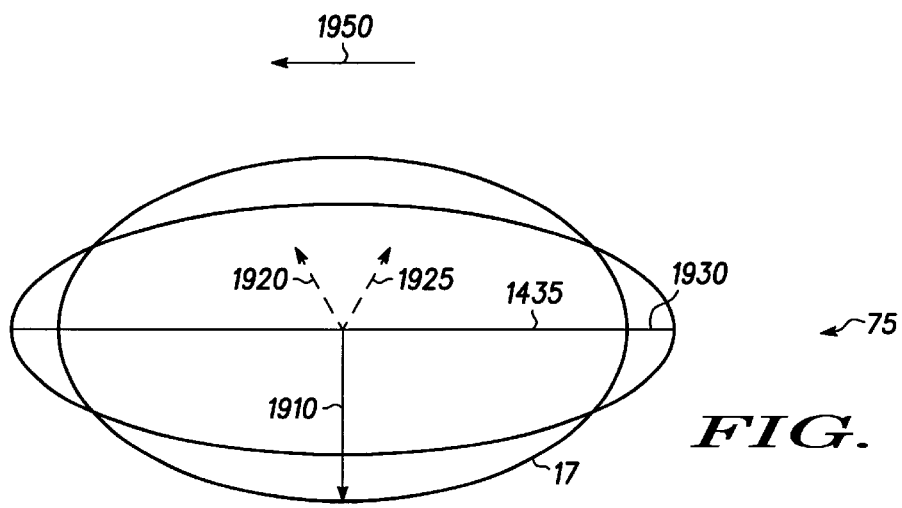
FIG. 20 is a plan view of the MRAM device described with reference to FIG. 20, in accordance with embodiments of the present invention.
Figure 21:
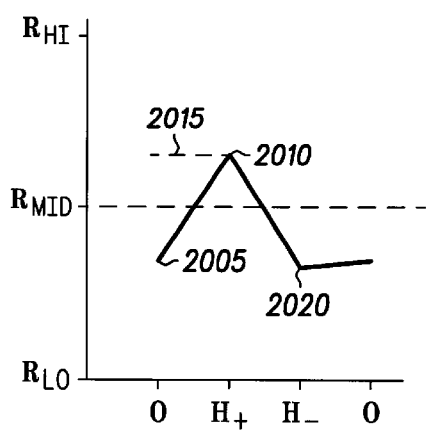
FIGS. 21 and 22 are graphs showing resistance values during read operation of the MRAM device described with reference to FIG. 20.
Figure 22:
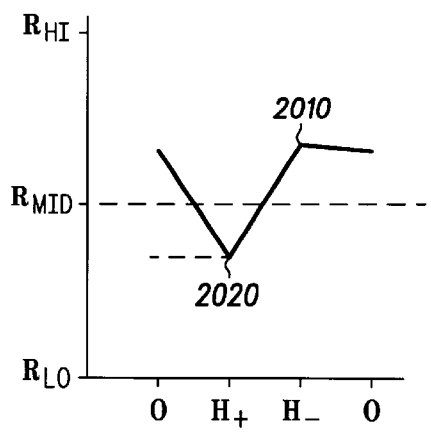

Referring to FIGS. 20–22, a plan view of an MRAM device 75 is shown in FIG. 20 and graphs of values of applied magnetic field versus resistance of the magnetoresistive tunnel junction device 75 are shown in FIGS. 21 and 22. In the MRAM device 75, the bit magnetic region 15 comprises any one of the structures described herein in with reference to FIG. 2 and with reference to FIGS. 4–6, in accordance with embodiments of the present invention. The reference magnetic region 17 of MRAM device 75 has the same vertical layer structure shown in FIG. 19 for the reference magnetic region 17 of MRAM device 74, with the layers 46, 66, 56, 57 being designed and implemented as in the first version of MRAM device 74. The bit magnetic region 15 has the bit easy axis 1435. MRAM device 75 differs from the MRAM device 74 in that the reference magnetic region 17 has an aspect ratio substantially greater than 1, with a long axis 1930 parallel to the bit easy axis 1435. The SAF tri-layer structure 83 of the MRAM device 75, like the SAF tri-layer structure of MRAM device 74, has a pinned magnetic moment 1910 in the ferromagnetic layer 56 (as known as the pinned layer 56) oriented substantially orthogonally to the bit easy axis 1435. However, the reference magnetic moment (in the ferromagnetic layer 46 adjacent to the tunneling barrier 16) is canted by an anisotropy of the reference magnetic region 17 in one of two directions, so that the reference magnetic moment adjacent to the tunneling barrier 16 has two stable positions 1920, 1925. The stable positions (or states) 1920, 1925 are at approximately equal angles from an orthogonal to the bit easy axis 1435. The reference magnetic region 17 is shown in FIG. 20 as having a smaller aspect ratio than the bit magnetic region 15, but this need not be the case. Various shape differences between region 15 and 17 can be used including the same shape or different shapes. The angle by which the reference magnetic moment is rotated from the orthogonal to the bit easy axis 1435 is determined by the rotational response strength (as described above with reference to FIGS. 14–18) of the reference magnetic moment and by an anisotropy of the ferromagnetic layer 46 in a direction parallel to the bit easy axis 1435. The anisotropy can be a shape anisotropy as illustrated in FIG. 20, but could be produced alternatively by the material property of the (magnetic layer 46) known as induced magnetic anisotropy, which are of course characteristics determined during the design of the MRAM 75. Thus, the shape can have any aspect ratio, including 1.

It will be appreciated that when the component of the reference magnetic moment that is in the bit easy axis 1435 has a direction opposite to the polarity of the bit magnetic moment adjacent to the tunneling barrier 16 in magnetic region 15, the magnetoresistance of the MRAM device 75 will be higher than when the component of the reference magnetic moment that is in the bit easy axis 1435 has a direction congruent to the polarity of the bit magnetic moment adjacent to the tunneling barrier 16 in magnetic region 15. Although there are two stable positions 1920, 1925 of the reference magnetic moment, they can be susceptible to external or thermal influences and change from one state to the other. Accordingly, although an application of one sense value of an applied magnetic field might be usable in some circumstances to determine the polarity of the bit magnetic moment by making an absolute reading of the magnetoresistance, a more preferable method of reading the polarity of the bit magnetic region 15 is to use an applied magnetic field having a sense value at least at a first polarity and then at a second polarity. In this method, the applied magnetic field is set at the sense value that is within the non-switching magnetic field region associated with a particular embodiment of the bit magnetic region 15 (e.g., magnetic field region 320 as described with reference to FIG. 3 and magnetic field region 92 as described with reference to FIG. 6), but strong enough to change the position of the reference magnetic moment between position 1920 and 1925. This method provides a reliable indication of the polarity of the bit magnetic moment by determining the sign of the change of the magnetoresistance of the MTJD. For example, when a bit magnetic moment adjacent to the tunnel barrier 16 of magnetic region 15 has the polarity 1950 shown in FIG. 20 and when a magnetic field generated by a current or currents in word and digit lines 20, 30 (FIG. 19) is applied that has a component (shown as H. in FIGS. 21 and 22) in the bit easy axis 1435 with the opposite polarity, the magnetoresistance will go from the magnetoresistance at the point 2005 of the graph in FIG. 21 to the magnetoresistance at the point 2010 if the reference magnetic moment was in position 1920 (FIG. 20) but will not change significantly from the magnetoresistance at the point 2015 of the graph if the reference magnetic moment was in already in position 1925 (FIG. 20). When the magnetic field is then applied having the component (shown as H. in FIGS. 21 and 22) in the bit easy axis 1435 with the same polarity as polarity 1950, the magnetoresistance will go from the magnetoresistance (between $R_{MID}$ and $R_{HI}$) at the point 2010 of the graph of FIG. 21 to the magnetoresistance (between resistance $R_{MID}$ and $R_{LO}$) at the point 2020 of the graph if the reference magnetic moment was in already in position 1925 (FIG. 20). In this example, when a bit magnetic moment has a polarity opposite the polarity 1950 shown in FIG. 20 and the same sequence of magnetic fields are applied, the magnetoresistance will change from the low value (between resistance $R_{MID}$ and $R_{LO}$) at point 2020 to the high value (between $R_{MID}$ and $R_{HI}$) at point 2010 as shown in the graph of FIG. 22, regardless of which state the reference magnetic moment was in before the read operation started. It can be seen from these graphs (FIGS. 21 and 22) that the polarity of the bit magnetic moment 1950 can be determined from the polarity of the change of the magnetoresistance of the MRAM device 75. Thus, as in the MRAM devices 73, 74, one or both of the word and digit lines 20, 30 can be used to generate the applied magnetic field used to read the stored bit magnetic moment, or a third line could be added for this purpose, depending on the technology of the bit magnetic region 15 and write operation.

Figure 23:
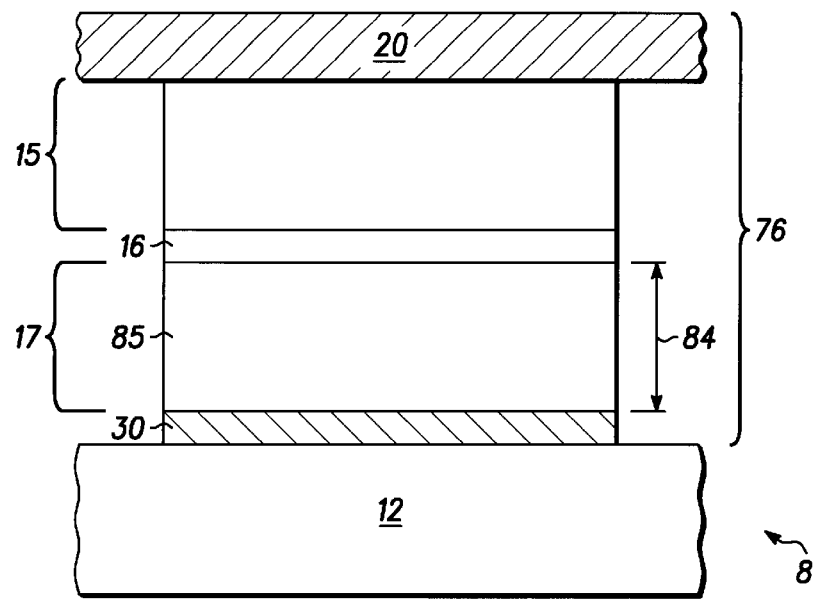
FIG. 23 is a cross sectional view of a portion of an MRAM array that includes an MRAM device, in accordance with embodiments of the present invention.
Figure 24:
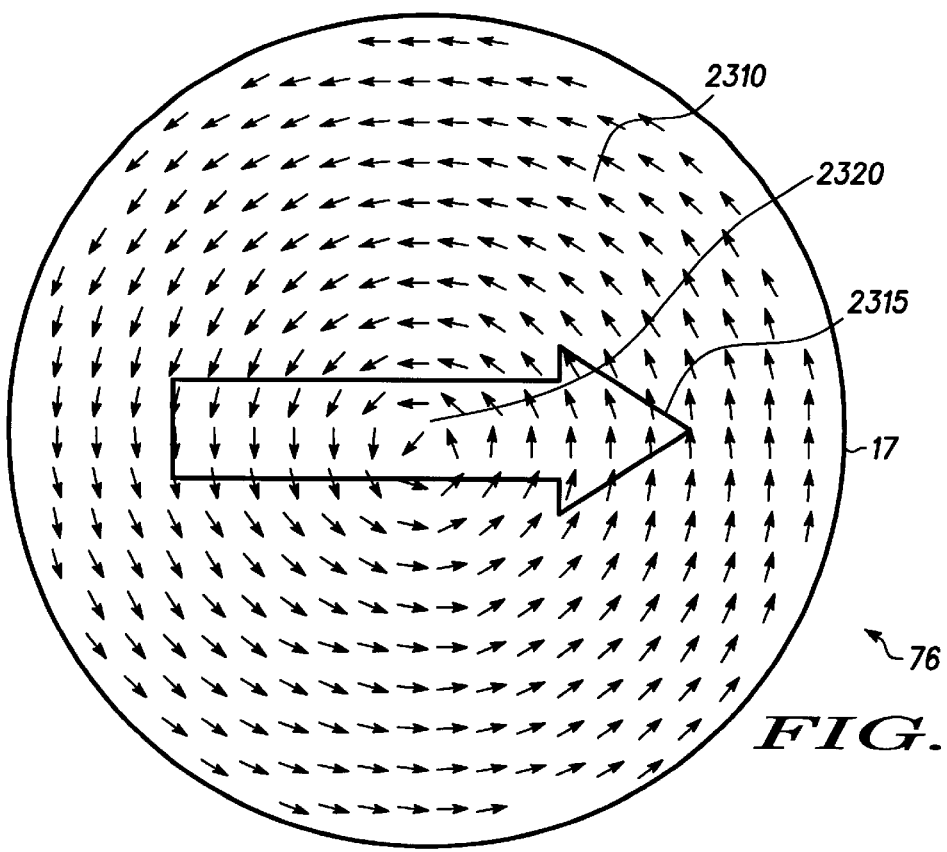
FIGS. 24 and 25 are plan views of the MRAM device described with reference to FIG. 23.
Figure 25:
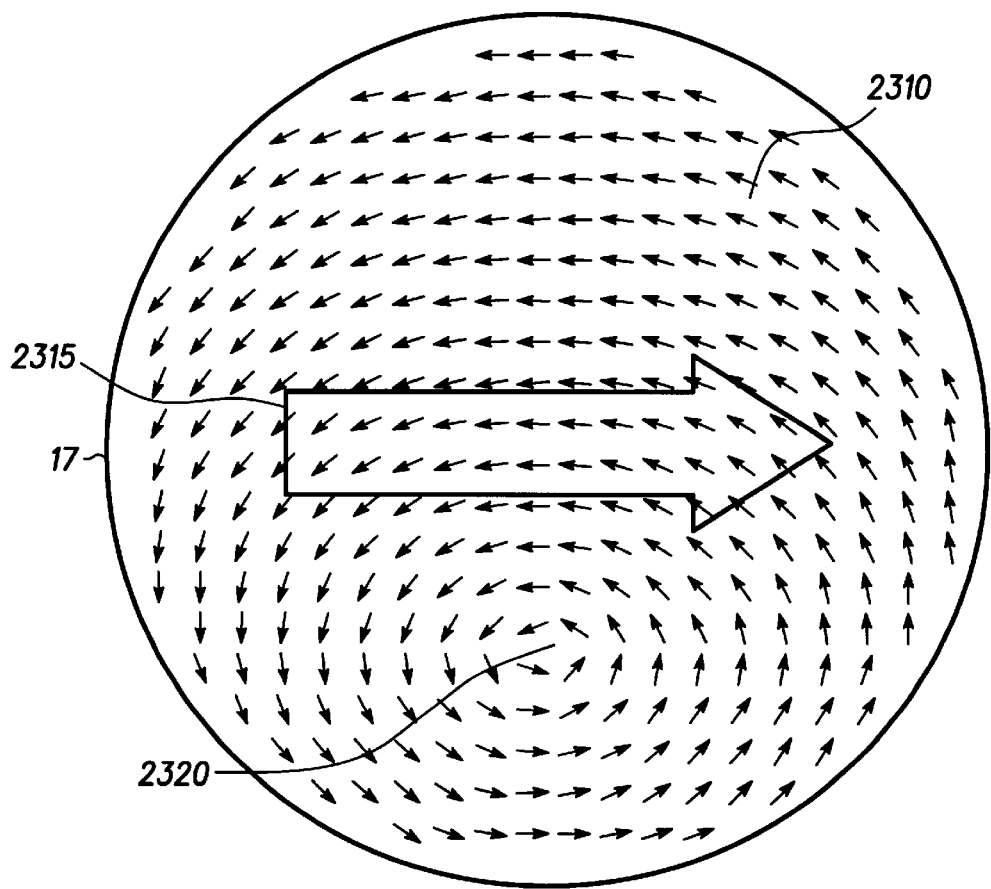

Referring to FIG. 23, a cross sectional view of a portion of an MRAM array 8 that includes an MRAM device 76 is shown, in accordance with embodiments of the present invention wherein the bit magnetic region 15 comprises any one of the structures described herein in with reference to FIG. 2 and with reference to FIGS. 4–6. Furthermore, reference magnetic region 17 in MRAM device 76 is an unpinned ferromagnetic layer 85 that is adjacent to the electrically insulating material forming the tunneling barrier 16. Ferromagnetic layer 85 includes at least one of elements Ni, Fe, Co, or combinations thereof, and is implemented having a shape with an aspect ratio that is approximately 1 (and preferably less than 1.3) by a process and with a thickness 84 that creates a magnetization vortex 2310, as shown in the plan view of the reference magnetic region 17 in FIG. 24. Thus, the reference magnetic region 17 has a vortex center 2320 at a center of the reference magnetic region 17 and a net magnetic moment of zero when there is no applied magnetic field, and the MRAM device 76 has a magnetoresistance that is defined herein as the reference magnetoresistance. A bit magnetic moment 2315 along the bit easy axis of the bit magnetic region 15 is also shown in FIG. 24. During a read operation of the MRAM device 76, a magnetic field applied in the bit easy axis causes the vortex center 2320 to move in a direction orthogonal to the bit easy axis, as shown in FIG. 25, and there will then exist a net magnetic moment in the reference magnetic region 17. When the applied magnetic field has an angle to the bit easy axis, the vortex center is moved in direction 90 degrees to the direction of the net applied field. The result, though, is till similar. For example, when a magnetic field is generated by a word or digit line 20, 30 that is oriented 45 degrees to the bit easy axis, as it would typically be when one of the word or digit lines 20, 30 is used for the read operation and the bit magnetic region 15 is read using Savtchenko technology, the vortex center moves in the direction of the applied magnetic field and a component exists in the bit easy axis that either opposes or is congruent to a stored bit magnetic moment. As long as the applied magnetic field is within a vortex region and is within the non-switching magnetic field region associated with the technology of the bit magnetic region 15, the polarity of the bit magnetic moment 2315 is reliably indicated by a sign of a change of the magnetoresistance of the MRAM device 76 from the reference magnetoresistance, and the bit magnetic moment 2315 is not switched. The vortex region is a region of applied magnetic field values within which the movement of the vortex center is reversible without hysteresis and linear in response to the component of the applied magnetic field.

A more general description of the embodiments described above is that the reference magnetic moment of the reference magnetic region 17 and its magnetic state can be altered by an applied magnetic field having a value in the non-switching magnetic field region associated with the technology of the bit magnetic region 15. This allows the free layers orientation to be determined by the behavior of the resistance as the reference magnetic moment is altered in a pre-described way. Using this technique allows each bit to be referenced to itself. This bypasses the need for small resistance variations between the high, low and midpoint bits. The state of all bits can be determined by the resistance changes due to the pre-described magnetic change in the state of a reference layer (i.e. self referencing) without the need for comparison to external bits as is currently the mode of operation.

In other words, the present invention can be generically described as a magnetoresistive tunneling junction memory cell comprising an electrically insulating material designed to form a magnetoresistive tunneling barrier, a bit magnetic region positioned on one side of the electrically insulating material, a reference magnetic region positioned on an opposite side of the electrically insulating material, and metallic conductors or other means to carry currents for inducing an applied magnetic field in the bit and reference magnetic regions. The bit magnetic region has a bit magnetic moment that has a polarity in a bit easy axis when there is no applied magnetic field; The electrically insulating material and the bit and reference magnetic regions form a magnetoresistive tunneling junction device MTJD. The reference magnetic region has a reference magnetic moment that has at least a first and a second value that correspond to first and second values of the applied magnetic field. (Note that in some embodiments one of the values of the applied magnetic field is zero.) The polarity of the bit magnetic moment is reliably determined by measurements of the magnetoresistance of the MTJD made at the first and second values of the applied magnetic field. The first and second values of the applied magnetic field are within a non-switching magnetic field region within which the state of the bit magnetic moment is not switched.

It will be appreciated that the MRAM arrays 3, 4, 5, 6, 7, 8 comprising, respectively, the MRAM devices 71, 72, 73, 74, 75, 76 (also called magnetoresistive tunneling junction devices) described herein, can be beneficially employed in a wide range of electro-optical integrated circuits, such as any circuits using almost any types of microprocessors or signal processors, and circuits needing state definitions. As a consequence, the MRAM devices 71–76 can be beneficially employed in virtually any electro-optical equipment that uses memory. And although a feature of the present invention is the non-volatility of the MRAM devices 71–76, it will be appreciated that the size and speed of these devices will not preclude their use in situations that up to now have not demanded non-volatile memories.

In the foregoing specification, the invention and the benefits thereof have been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims.

As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

Having fully described the invention in such clear and concise terms as to enable those skilled in the art to understand and practice the same.

The invention claimed is:

1. A magnetoresistive tunneling junction memory cell comprising:

an electrically insulating material designed to form a magnetoresistive tunneling barrier;

a bit magnetic region positioned on one side of the electrically insulating material, the bit magnetic region having a bit magnetic moment that has a polarity in a bit easy axis when there is no applied magnetic field;

a reference magnetic region positioned on an opposite side of the electrically insulating material, wherein the electrically insulating material and the bit and reference magnetic regions form a magnetoresistive tunneling junction device (MTJD); and means for inducing an applied magnetic field in the bit and reference magnetic regions;

wherein the reference magnetic region has a low aspect ratio and has a reference magnetic moment that is substantially orthogonal to the bit easy axis when the applied magnetic field has a magnitude of zero, at which magnitude the MTJD has a reference magnetoresistance, and wherein the polarity of the bit magnetic moment is reliably indicated by a sign of a change of the magnetoresistance of the MTJD from a rotation of the reference magnetic moment, and the polarity of the bit magnetic moment is not switched, when the applied magnetic field has a sense value that is within a non-switching magnetic field region.

2. The magnetoresistive tunneling junction memory cell according to claim 1, wherein the reference magnetic region comprises a pinned magnetic layer for providing the reference magnetic moment, comprising:

a ferromagnetic layer that is adjacent to the electrically insulating material; and an anti-ferromagnetic layer adjacent to the ferromagnetic layer.

3. The magnetoresistive tunneling junction memory cell according to claim 1, wherein the reference magnetic region comprises:

a pinning anti-ferromagnetic layer that has a pinning direction orthogonal to the bit easy axis; and a synthetic anti-ferromagnetic layer (SAF) that is adjacent to the pinning anti-ferromagnetic layer and the electrically insulating material, and provides the reference magnetic moment, wherein the reference magnetic moment has a rotational response strength such that the reference magnetic moment is rotated by the applied magnetic field having the sense value, and wherein the rotational response strength is determined by a combination of a coupling layer strength in the SAF, magnetic anisotropy and a moment imbalance of ferromagnetic layers of the SAF.

4. The magnetoresistive tunneling junction memory cell according to claim 3, wherein the SAF comprises N ferromagnetic layers which are anti-ferromagnetically coupled, where N is an integer number greater than or equal to two.

5. The magnetoresistive tunneling junction memory cell according to claim 1, wherein an aspect ratio of the reference magnetic region is between 0.6 and 1.4.

6. The magnetoresistive tunneling junction memory cell according to claim 5, wherein an aspect ratio of the reference magnetic region is between 0.8 and 1.2.

7. The magnetoresistive tunneling junction memory cell according to claim 6, wherein the means for inducing an applied magnetic field in the bit and reference magnetic regions comprises:
- a word line passing near one of the bit and reference magnetic regions; and
- a digit line orthogonal to the word line and passing near the other of the bit and reference magnetic regions,
- wherein the word and digit lines are oriented substantially 45 degrees with respect to the bit easy axis.

8. The magnetoresistive tunneling junction memory cell according to claim 7, wherein the means for inducing an applied magnetic field in the bit and reference magnetic regions further comprises a read line passing near the reference magnetic region.

9. The magnetoresistive tunneling junction memory cell according to claim 6, wherein the means for inducing an applied magnetic field in the bit and reference magnetic regions comprises:
- a word line passing near one of the bit and reference magnetic regions; and
- a digit line orthogonal to the word line and passing near the other of the bit and reference magnetic regions,
- wherein one of the word and digit lines is oriented substantially orthogonal to the bit easy axis.

10. The magnetoresistive tunneling junction memory cell according to claim 1, wherein the bit magnetic region comprises N ferromagnetic layers which are anti-ferromagnetically coupled, where N is an integer number greater than or equal to two.

11. An integrated circuit comprising the magnetoresistive tunneling junction memory cell according to claim 1.

12. An electro-optical equipment comprising the magnetoresistive tunneling junction memory cell according to claim 1.

13. A magnetoresistive tunneling junction memory cell comprising:
- an electrically insulating material designed to form a magnetoresistive tunneling barrier;
- a bit magnetic region positioned on one side of the electrically insulating material, the bit magnetic region having a bit magnetic moment that has a polarity in a bit easy axis when there is no applied magnetic field;
- a reference magnetic region positioned on an opposite side of the , wherein the electrically insulating material and the bit and reference magnetic regions form a magnetoresistive tunneling junction device (MTJD); and
- a means for inducing an applied magnetic field in the bit and reference magnetic regions,
- wherein the reference magnetic region has a reference magnetic moment that has two stable positions generated by an anisotropy of the reference magnetic region at approximately equal angles from an orthogonal to the bit easy axis when the applied magnetic field has a magnitude of zero, and
- wherein the polarity of the bit magnetic moment is reliably indicated by a sign of a change of a magnetoresistance of the MTJD and the polarity of the bit magnetic moment is not switched when a component of the applied magnetic field is changed from a first polarity to a second polarity in the bit easy axis while the applied magnetic field has a sense value that is within a non-switching magnetic field region.

14. The magnetoresistive tunneling junction memory cell according to claim 13, wherein the anisotropy is generated by an aspect ratio of the reference magnetic region that is greater than 1.

15. The magnetoresistive tunneling junction memory cell according to claim 13, wherein the anisotropy is generated by an aspect ratio of the reference magnetic region that is between 1.5 and 3.0.

16. The magnetoresistive tunneling junction memory cell according to claim 13, wherein the reference magnetic region comprises:
- a pinning anti-ferromagnetic layer that has a pinning direction that is orthogonal to the bit easy axis; and
- a synthetic anti-ferromagnetic layer (SAF) that is adjacent to the pinning anti-ferromagnetic layer and the electrically insulating material, and provides the reference magnetic moment based on the anisotropy and a combination of the pinning direction and a strength of a coupling layer of the SAF.

17. The magnetoresistive tunneling junction memory cell according to claim 16, wherein the anisotropy is at least partially generated by induced magnetic anisotrpy properties of a ferromagnetic layer of the SAF that is adjacent to the electrically insulating material.

18. The magnetoresistive tunneling junction memory cell according to claim 16, wherein the anisotropy is generated by an aspect ratio of the reference magnetic region that is greater than 1.

19. The magnetoresistive tunneling junction memory cell according to claim 18, wherein the anisotropy is generated by an aspect ratio of the reference magnetic region that is between 1.5 and 3.0.

20. The magnetoresistive tunneling junction memory cell according to claim 13, wherein the bit magnetic region comprises N ferromagnetic layers which are anti-ferromagnetically coupled, where N is an integer number greater than or equal to two, and each layer has a thickness.

21. The magnetoresistive tunneling junction memory cell according to claim 13, wherein the means for inducing an applied magnetic field in the bit and reference magnetic regions comprises:
- a word line passing near one of the bit and reference magnetic regions; and
- a digit line orthogonal to the word line and passing near the other of the bit and reference magnetic regions,
- wherein the word and digit lines are oriented substantially 45 degrees with respect to the bit easy axis.

22. The magnetoresistive tunneling junction memory cell according to claim 21, wherein the means for inducing an applied magnetic field in the bit and reference magnetic regions further comprises a read line passing near the reference magnetic region.

23. The magnetoresistive tunneling junction memory cell according to claim 13, wherein the means for inducing an applied magnetic field in the bit and reference magnetic regions comprises:
- a word line passing near one of the bit and reference magnetic regions; and a digit line orthogonal to the word line and passing near the other of the bit and reference magnetic regions, wherein one of the word and digit lines is oriented substantially orthogonal to the bit easy axis.

24. An integrated circuit comprising the magnetoresistive tunneling junction memory cell according to claim 13.

25. An electro-optical equipment comprising the magnetoresistive tunneling junction memory cell according to claim 13.

26. A magnetoresistive tunneling junction memory cell comprising:

an electrically insulating material designed to form a magnetoresistive tunneling barrier;

a bit magnetic region positioned on one side of the electrically insulating material, the bit magnetic region having a bit magnetic moment that is a polarity in a bit easy axis when there is no applied magnetic field;

a reference magnetic region positioned on an opposite side of the electrically insulating material, the reference magnetic region having an aspect ratio of the reference magnetic region of approximately 1 and comprising a single unpinned ferromagnetic layer of sufficient thickness to form a magnetic vortex with net zero magnetic moment when the applied magnetic field is zero, wherein the electrically insulating material and the bit and reference magnetic regions form a magnetoresistive tunneling junction device (MTJD); and a means for inducing an applied magnetic field in the bit and reference magnetic regions, wherein the MTJD has a reference magnetoresistance when the applied magnetic field has a magnitude of zero, and wherein the polarity of the bit magnetic moment is reliably indicated by a sign of a change of the magnetoresistance of the MTJD from the reference magnetoresistance and the state of the bit magnetic moment is not switched, when the applied magnetic field has a sense value that is within a non-switching magnetic field region and a vortex field region.

27. The magnetoresistive tunneling junction memory cell according to claim 26, wherein the aspect ratio of the reference magnetic region is less than 1.3.

28. The magnetoresistive tunneling junction memory cell according to claim 26, wherein the bit magnetic region comprises N ferromagnetic layers which are anti-ferromagnetically coupled, where N is an integer number greater than or equal to two, and each layer has a thickness.

29. The magnetoresistive tunneling junction memory cell according to claim 28, wherein the N ferromagnetic layers are anti-ferromagnetically coupled by sandwiching a layer of anti-ferromagnetic coupling material between each adjacent pair of ferromagnetic layers.

30. The magnetoresistive tunneling junction memory cell according to claim 26, wherein the means for inducing an applied magnetic field in the bit and reference magnetic regions comprises:

a word line passing near one of the bit and reference magnetic regions; and a digit line orthogonal to the word line and passing near the other of the bit and reference magnetic regions, and wherein the word and digit lines are oriented 45 degrees with respect to the bit easy axis.

31. The magnetoresistive tunneling junction memory cell according to claim 30, wherein the means for inducing an applied magnetic field in the bit and reference magnetic regions further comprises a read line passing near the reference magnetic region.

32. The magnetoresistive tunneling junction memory cell according to claim 26, wherein the means for inducing an applied magnetic field in the bit and reference magnetic regions comprises:

a word line passing near one of the bit and reference magnetic regions; and a digit line orthogonal to the word line and passing near the other of the bit and reference magnetic regions, and wherein one of the word and digit lines is oriented substantially orthogonally to the bit easy axis.

33. An integrated circuit comprising the magnetoresistive tunneling junction memory cell according to claim 26.

34. An electro-optical equipment comprising the magnetoresistive tunneling junction memory cell according to claim 26.

35. A magnetoresistive tunneling junction memory cell comprising:

an electrically insulating material designed to form a magnetoresistive tunneling barrier;

a bit magnetic region positioned on one side of the electrically insulating material, the bit magnetic region having a bit magnetic moment that has a polarity in a bit easy axis when there is no applied magnetic field;

a reference magnetic region positioned on an opposite side of the electrically insulating material, wherein the electrically insulating material and the bit and reference magnetic regions form a magnetoresistive tunneling junction device (MTJD); and current carrying conductors for inducing an applied magnetic field in the bit and reference magnetic regions, wherein the reference magnetic region has a reference magnetic moment that has at least a first and a second value that correspond to first and second values of the applied magnetic field, and wherein the polarity of the bit magnetic moment is reliably determined by measurements of a magnetoresistance of the MTJD made at the first and second values of the applied magnetic field, and wherein the first and second values of the applied magnetic field are within a non-switching magnetic field region within which the polarity of the bit magnetic moment is not switched.

36. An integrated circuit comprising the magnetoresistive tunneling junction memory cell according to claim 35.

37. An electro-optical equipment comprising the magnetoresistive tunneling junction memory cell according to claim 35.

* * * * *